US012563820B2

(12) United States Patent
Takei et al.

(10) Patent No.: US 12,563,820 B2
(45) Date of Patent: Feb. 24, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Manabu Takei, Shiojiri (JP); Masakazu Baba, Tsukuba (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 471 days.

(21) Appl. No.: 18/091,159

(22) Filed: Dec. 29, 2022

(65) Prior Publication Data

US 2023/0253491 A1 Aug. 10, 2023

(30) Foreign Application Priority Data

Feb. 7, 2022 (JP) ................................. 2022-017532

(51) Int. Cl.
H10D 84/00 (2025.01)
H01L 21/04 (2006.01)
(Continued)

(52) U.S. Cl.
CPC ......... H10D 84/146 (2025.01); H01L 21/046 (2013.01); H10D 12/031 (2025.01);
(Continued)

(58) Field of Classification Search
CPC .. H10D 84/146; H10D 12/031; H10D 30/668; H10D 62/109; H10D 62/8325;
(Continued)

(56) References Cited

U.S. PATENT DOCUMENTS 6,198,130 B1 3/2001 Nobuto et al.
2008/0012050 A1 1/2008 Aoki et al.
(Continued)

FOREIGN PATENT DOCUMENTS

JP H1154748 A 2/1999
JP 2008021930 A 1/2008
(Continued)

OTHER PUBLICATIONS

Office Action issued for corresponding Japanese Patent Application No. 2022-017532 dated Nov. 11, 2025.

*Primary Examiner* — William B Partridge
*Assistant Examiner* — David Paul Sedorook
(74) *Attorney, Agent, or Firm* — Rabin & Berdo, P.C.

(57) ABSTRACT

A silicon carbide semiconductor device, including a semiconductor substrate, a first semiconductor region, a plurality of second semiconductor regions, a plurality of third semiconductor regions, a plurality of trenches, a plurality of gate electrodes respectively provided in the trenches, a first conductive film, a first electrode, a second electrode, a plurality of first high-concentration regions, a plurality of second high-concentration regions, and a second conductive film. The first semiconductor region has a first portion and a plurality of second portions respectively at positions facing the plurality of second high-concentration regions in a depth direction. The second conductive film forms a Schottky contact with the plurality of second portions of the first semiconductor region, such that each junction surface between the second conductive film and the first semiconductor region forms a Schottky barrier of a Schottky barrier diode.

12 Claims, 17 Drawing Sheets

(51) Int. Cl.

| | | |
|---|---|---|
| *H10D 12/01* | (2025.01) | |
| *H10D 30/66* | (2025.01) | |
| *H10D 62/10* | (2025.01) | |
| *H10D 62/832* | (2025.01) | |

(52) U.S. Cl.
CPC ......... *H10D 30/668* (2025.01); *H10D 62/109* (2025.01); *H10D 62/8325* (2025.01)

(58) Field of Classification Search
CPC ...... H10D 8/60; H10D 30/665; H10D 62/127; H10D 62/157; H10D 62/393; H10D 62/107; H01L 21/046; H01L 29/0615; H01L 29/0619; H01L 29/0878; H01L 29/47
See application file for complete search history.

(56) References Cited

U.S. PATENT DOCUMENTS

| | | | | |
|---|---|---|---|---|
| 2014/0231827 | A1 | 8/2014 | Watanabe et al. | |
| 2014/0231867 | A1* | 8/2014 | Yamashita | H10D 8/60 |
| | | | | 257/140 |
| 2018/0182885 | A1 | 6/2018 | Kobayashi | |
| 2018/0308972 | A1 | 10/2018 | Ohse et al. | |
| 2019/0074373 | A1 | 3/2019 | Kobayashi et al. | |
| 2019/0280118 | A1* | 9/2019 | Kobayashi | H10D 30/668 |
| 2019/0386131 | A1* | 12/2019 | Takeuchi | H10D 62/104 |
| 2020/0243641 | A1* | 7/2020 | Nakagawa | H10D 64/518 |
| 2021/0074808 | A1 | 3/2021 | Nishimura | |
| 2021/0288156 | A1* | 9/2021 | Fukui | H10D 64/64 |

FOREIGN PATENT DOCUMENTS

| | | | |
|---|---|---|---|
| JP | 2014157896 | A | 8/2014 |
| JP | 2018107168 | A | 7/2018 |
| JP | 2018182234 | A | 11/2018 |
| JP | 2019050352 | A | 3/2019 |
| JP | 2019160898 | A | 9/2019 |
| JP | 2021044356 | A | 3/2021 |

* cited by examiner

| N (25℃) | |
|---|---|
| ACCELERATION ENERGY | DOSE AMOUNT |
| (keV) | (/cm²) |
| 700 | $4.0 \times 10^{12}$ |
| 550 | $3.0 \times 10^{12}$ |
| 450 | $2.5 \times 10^{12}$ |
| 310 | $4.0 \times 10^{12}$ |
| 190 | $4.0 \times 10^{12}$ |
| 100 | $2.5 \times 10^{12}$ |
| 50 | $1.3 \times 10^{12}$ |
| 30 | $1.0 \times 10^{12}$ |

| AI (500℃) | |
|---|---|
| ACCELERATION ENERGY | DOSE AMOUNT |
| (keV) | (/cm²) |
| 700 | $5\times10^{12}$ |
| 550 | $1\times10^{12}$ |
| 500 | $9.5\times10^{11}$ |
| 360 | $2.2\times10^{12}$ |
| 220 | $2\times10^{12}$ |
| 150 | $1.1\times10^{12}$ |
| 80 | $1\times10^{12}$ |
| 30 | $7\times10^{11}$ |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-017532, filed on Feb. 7, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

A device with a built-in Schottky barrier diode (SBD) formed by a conductive layer disposed in a flat plate-like shape on a front surface of a single semiconductor substrate (semiconductor chip) that has a trench gate metal oxide semiconductor field effect transistor (MOSFET) is one conventionally known semiconductor device in which silicon carbide (SiC) is used as a semiconductor material (hereinafter, silicon carbide semiconductor device).

In the MOSFET on the single semiconductor substrate that has the built-in SBD, the built-in SBD operates concurrently with the MOSFET when the MOSFET is ON and exhibits static properties of a same extent as a body diode of the MOSFET. The body diode of the MOSFET is a parasitic p-intrinsic-n (pin) diode formed by a pn junction between a p-type base region, an $n^-$-type drift region, and an $n^+$-type drain region. Further, the built-in SBD having a forward voltage lower than a forward voltage of the body diode of the MOSFET preferentially operates when the MOSFET is OFF.

Preferential operation of the built-in SBD occurs as a result of the body diode of the MOSFET and the built-in SBD sharing the $n^-$-type drift region, whereby potential of the pn junction of the body diode of the MOSFET becomes about equal to potential of a Schottky contact portion between the conductive layer configuring the built-in SBD and the semiconductor substrate and thus, conduction of the body diode of the MOSFET becomes difficult. The body diode of the MOSFET does not conduct until a current larger than normal flows through the MOSFET or a voltage higher than normal is applied to the MOSFET.

When the body diode conducts, due to bipolar operation of the body diode, holes are injected into the $n^-$-type drift region and due to recombination of the holes and electrons in the $n^-$-type drift region, stacking faults originating from basal plane dislocations in the semiconductor substrate expand. Due to this expansion of stacking faults, forward characteristics of the body diode degrade. As described above, the SBD is built-in and conduction of the body diode becomes difficult, whereby degradation of forward characteristics of the body diode are suppressed compared to a typical MOSFET without a built-in SBD.

A structure of a conventional silicon carbide semiconductor device is described. FIG. 26 is a cross-sectional view depicting the structure of the conventional silicon carbide semiconductor device. A conventional silicon carbide semiconductor device 110 depicted in FIG. 26 is a vertical trench gate MOSFET 131 in which, on a front surface of a single semiconductor substrate 140 thereof containing silicon carbide, an SBD (hereinafter, planar SBD) 132 is disposed in flat plate-like shape. Unit cells of (functional units of a device element) the MOSFET 131 and unit cells of the planar SBD 132 are disposed alternating one another in a first direction X parallel to the front surface of the semiconductor substrate 140.

The semiconductor substrate 140 is formed by epitaxially growing an $n^-$-type epitaxial layer 142 constituting an $n^-$-type drift region 102 on an $n^+$-type starting substrate 141 containing silicon carbide. In a front side of the semiconductor substrate 140 (main surface including the $n^-$-type epitaxial layer 142), trenches (hereinafter, gate trenches) 107 in which MOS gates of the MOSFET 131 are embedded are disposed at predetermined intervals in the first direction X, each adjacent two of the gate trenches 107 has disposed therebetween one unit cell of the MOSFET 131 or one unit cell of the planar SBD 132.

The MOSFET 131, between an adjacent two of the gate trenches 107, has an n-type current spreading region 103, a p-type base region 104, an $n^+$-type source region 105, and a $p^{++}$-type contact region 106. A portion between respective centers of the adjacent two of the gate trenches 107 sandwiching the p-type base region 104, the $n^+$-type source region 105, and the $p^{++}$-type contact region 106 constitutes a single unit cell of the MOSFET 131. Reference numerals 121, 122, and 123 are $p^+$-type regions that mitigate electric field applied to a gate insulating film 108 at bottoms of the gate trenches 107.

The planar SBD 132 is disposed between an adjacent two of the gate trenches 107 between which is free of the MOSFET 131; the planar SBD 132 has only the n-type current spreading region 103, which reaches the front surface of the semiconductor substrate 140, between the adjacent two of the gate trenches 107 free of the MOSFET 131 therebetween. Between the adjacent two of the gate trenches 107, that sandwich only the n-type current spreading region 103, a Schottky contact portion 112a between the n-type current spreading region 103 and a conductive layer 112 disposed on the front surface of the semiconductor substrate 140 configures a single unit cell of the planar SBD 132.

The gate trenches 107 are disposed in a striped pattern in a second direction Y that is parallel to the front surface of the semiconductor substrate 140 and orthogonal to the first direction X. The MOSFET 131 and the planar SBD 132 extend linearly in the second direction Y, parallel to the gate trenches 107. Reference numeral 111 is a conductive layer in ohmic contact with the $n^+$-type source region 105 and the $p^{++}$-type contact region 106. Reference numerals 101, 109, 113, 114, and 115 are $n^+$-type drain regions, gate electrodes, an interlayer insulating film, a front electrode, and a back electrode, respectively.

As for a conventional trench gate MOSFET, a device has been proposed in which between adjacent gate trenches (between which is free of a MOSFET), a planar SBD is disposed at the front surface of the semiconductor substrate (for example, refer to Japanese Laid-Open Patent Publication No. 2019-160898, Japanese Laid-Open Patent Publication No. 2008-021930, and Japanese Laid-Open Patent Publication No. H11-054748). As for another conventional trench gate MOSFET, a device has been proposed that in a center between adjacent gate trenches between which a MOSFET is disposed, has a mesa portion (groove) that reaches an n-type current spreading region from the front surface of the semiconductor substrate, and at a bottom of the mesa portion, a planar SBD is disposed (for example, refer to Japanese Laid-Open Patent Publication No. 2018-182234).

SUMMARY OF THE INVENTION

According to an embodiment of the invention, a silicon carbide semiconductor device includes: a semiconductor substrate containing silicon carbide, the semiconductor substrate having a first main surface and a second main surface opposite to each other; a first semiconductor region of a first conductivity type, provided in the semiconductor substrate; a plurality of second semiconductor regions of a second conductivity type, selectively provided between the first main surface of the semiconductor substrate and the first semiconductor region; a plurality of third semiconductor regions of the first conductivity type, selectively provided between the first main surface of the semiconductor substrate and the plurality of second semiconductor regions; a plurality of trenches, respectively penetrating through the plurality of third semiconductor regions and through the plurality of second semiconductor regions, and reaching the first semiconductor region; a plurality of gate electrodes, each provided in one of the plurality of trenches via a gate insulating film; a first conductive film provided at the first main surface of the semiconductor substrate, in ohmic contact with the plurality of second semiconductor regions and the plurality of third semiconductor regions; a first electrode provided on the first main surface of the semiconductor substrate and connected to the first conductive film; a second electrode provided on the second main surface of the semiconductor substrate; a plurality of first high-concentration regions of the second conductivity type, selectively provided between the first main surface of the semiconductor substrate and the first semiconductor region and apart from the second semiconductor regions, the plurality of first high-concentration regions being closer to the second electrode than are bottoms of the plurality of trenches, and respectively facing the plurality of trenches in a depth direction of the silicon carbide semiconductor device; a plurality of second high-concentration regions of the second conductivity type, selectively provided between the first main surface of the semiconductor substrate and the first semiconductor region, the plurality of second high-concentration regions being apart from the plurality of trenches, the plurality of second semiconductor regions, and the plurality of first high-concentration regions, the plurality of second high-concentration regions being closer to the second electrode than are the bottoms of the plurality of trenches; and a second conductive film provided on the first main surface of the semiconductor substrate, the second conductive film being connected to the first electrode. The first semiconductor region has: a first portion that is closer to the second electrode than is the plurality of second semiconductor regions, the first portion forming a portion of a sidewall of each of the plurality of trenches, and a plurality of second portions respectively at positions facing the plurality of second high-concentration regions in the depth direction, the plurality of second portions being exposed at the first main surface of the semiconductor substrate, and each being sandwiched between adjacent two of the plurality of second semiconductor regions in a top view of the silicon carbide semiconductor device. The second conductive film forms a Schottky contact with the plurality of second portions of the first semiconductor region, such that each junction surface between the second conductive film and the first semiconductor region forms a Schottky barrier of a Schottky barrier diode.

Objects, features, and advantages of the present invention are specifically set forth in or will become apparent from the following detailed description of the invention when read in conjunction with the accompanying drawings.

DETAILED DESCRIPTION OF THE INVENTION

Figure 26:
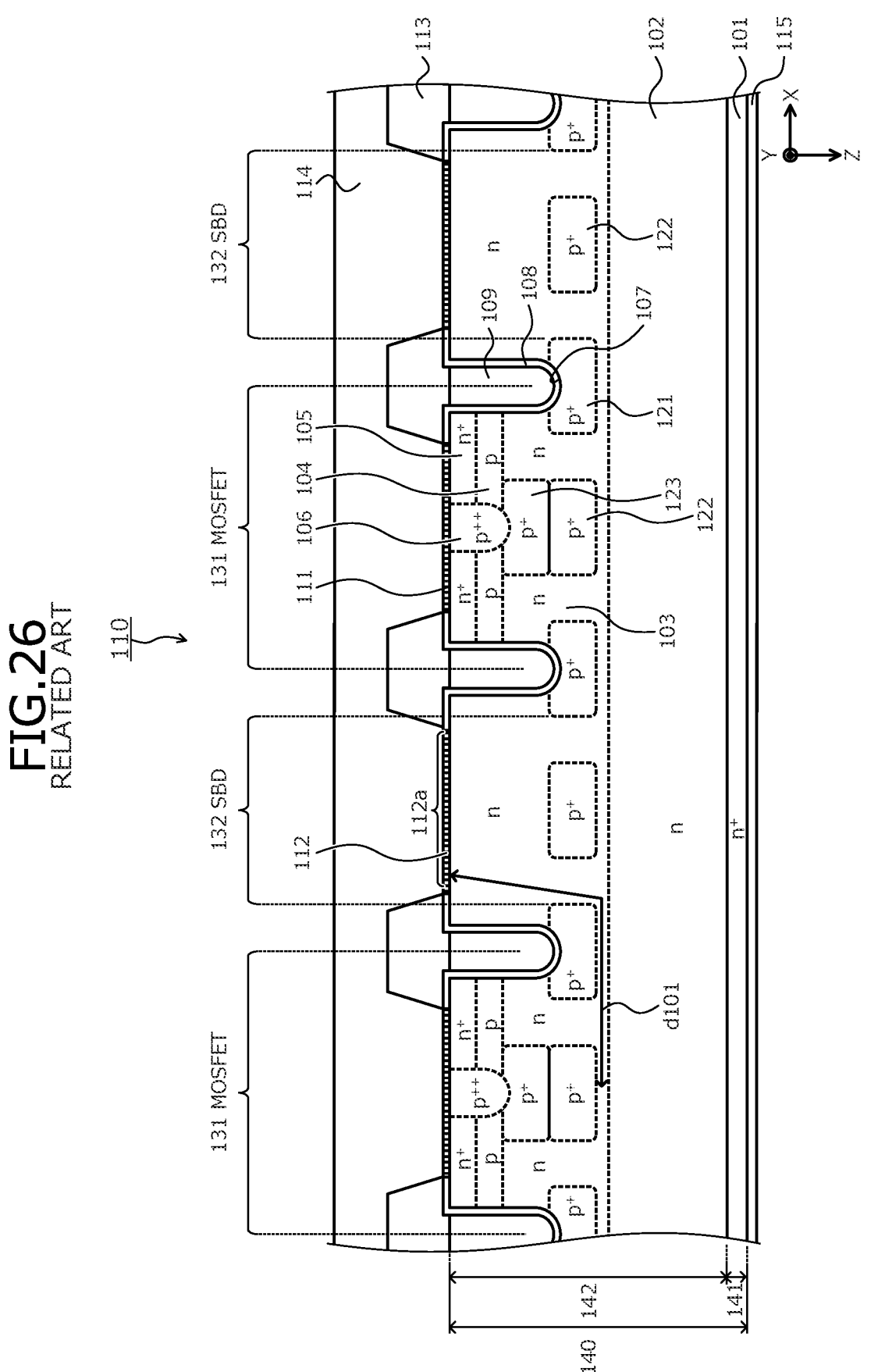
FIG. 26 is a cross-sectional view depicting a structure of a conventional silicon carbide semiconductor device.

First, problems associated with the conventional techniques are discussed. In the conventional silicon carbide semiconductor device 110 described above (refer to FIG. 26), between a predetermined adjacent two of the gate trenches 107, the planar SBD 132 is disposed instead of the gate structure of the MOSFET 131. Therefore, compared to a MOSFET without a built-in SBD (MOSFET in which a gate structure is disposed between all adjacent gate trenches), in the surface of the semiconductor substrate 140, unit cell density per unit area is lower for the MOSFET 131 and ON resistance of the MOSFET 131 is higher.

Further, at one (pn junction between the p$^+$-type region 122 and the n-type current spreading region 103) of the pn junctions (pn junctions between the p$^{++}$-type contact region 106, the p-type base region 104, the p$^+$-type regions 121 to 123, the n-type current spreading region 103, the n$^-$-type drift region 102, and the n$^+$-type drain region 101) forming a parasitic pin diode (body diode) in the MOSFET 131, a distance d101 between said pn junction and the planar SBD 132 increases. Therefore, a problem arises in that at a portion apart from the planar SBD 132, conduction of a body diode easily occurs.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. In the description of the embodiments below and the accompanying drawings, main portions that are identical will be given the same reference numerals and will not be repeatedly described.

Figure 1:
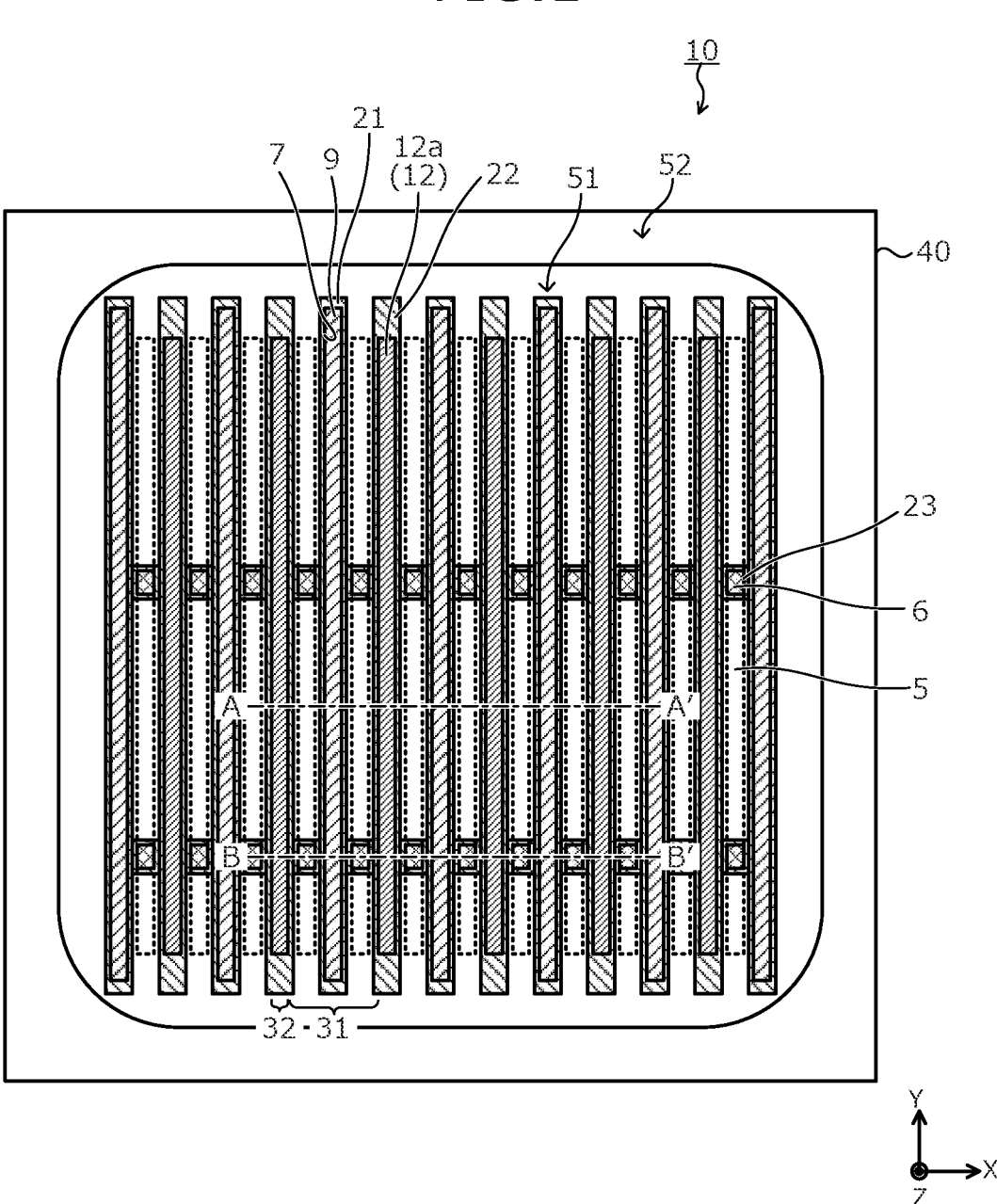
FIG. 1 is a plan view depicting a layout when a silicon carbide semiconductor device according a the first embodiment is viewed from a front side of a semiconductor substrate thereof.

A structure of a silicon carbide (SiC) semiconductor device according to a first embodiment is described. FIG. 1 is a plan view depicting a layout when the silicon carbide semiconductor device according to the first embodiment is viewed from a front side of a semiconductor substrate thereof. FIG. 1 depicts a layout (arrangement) of MOS gates (gate insulating films 8 and gate electrodes 9) of MOSFETs 31, planar SBDs 32 (Schottky contact portions 12a of a conductive layer (second conductive film) 12), n$^+$-type source regions (third semiconductor regions) 5, p$^{++}$-type contact regions (fourth semiconductor regions) 6, and p$^+$-type regions (first, second, third high-concentration regions) 21, 22, 23.

Figure 2:
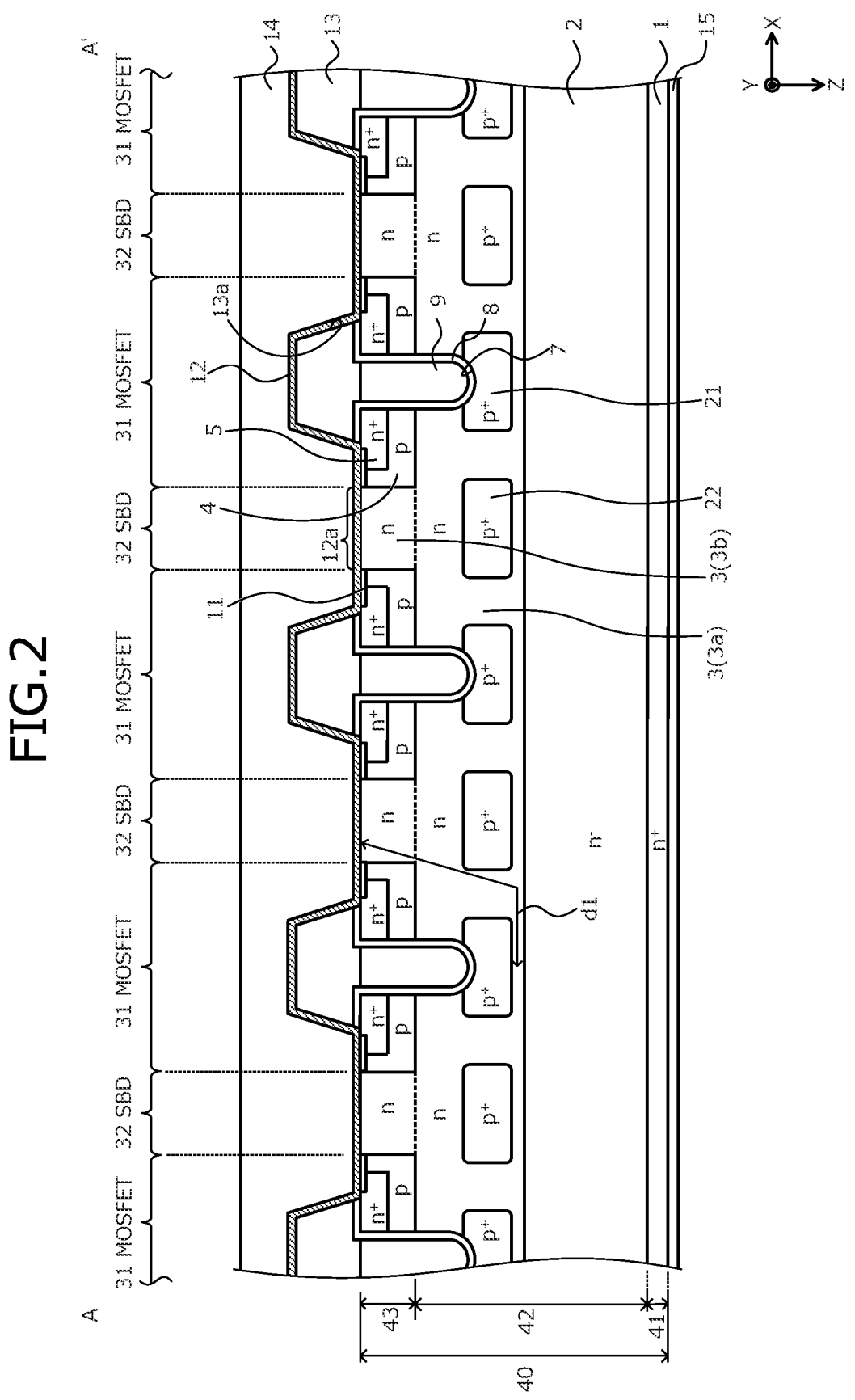
FIG. 2 is a cross-sectional view depicting a structure along cutting line A-A' in FIG. 1.
Figure 3:
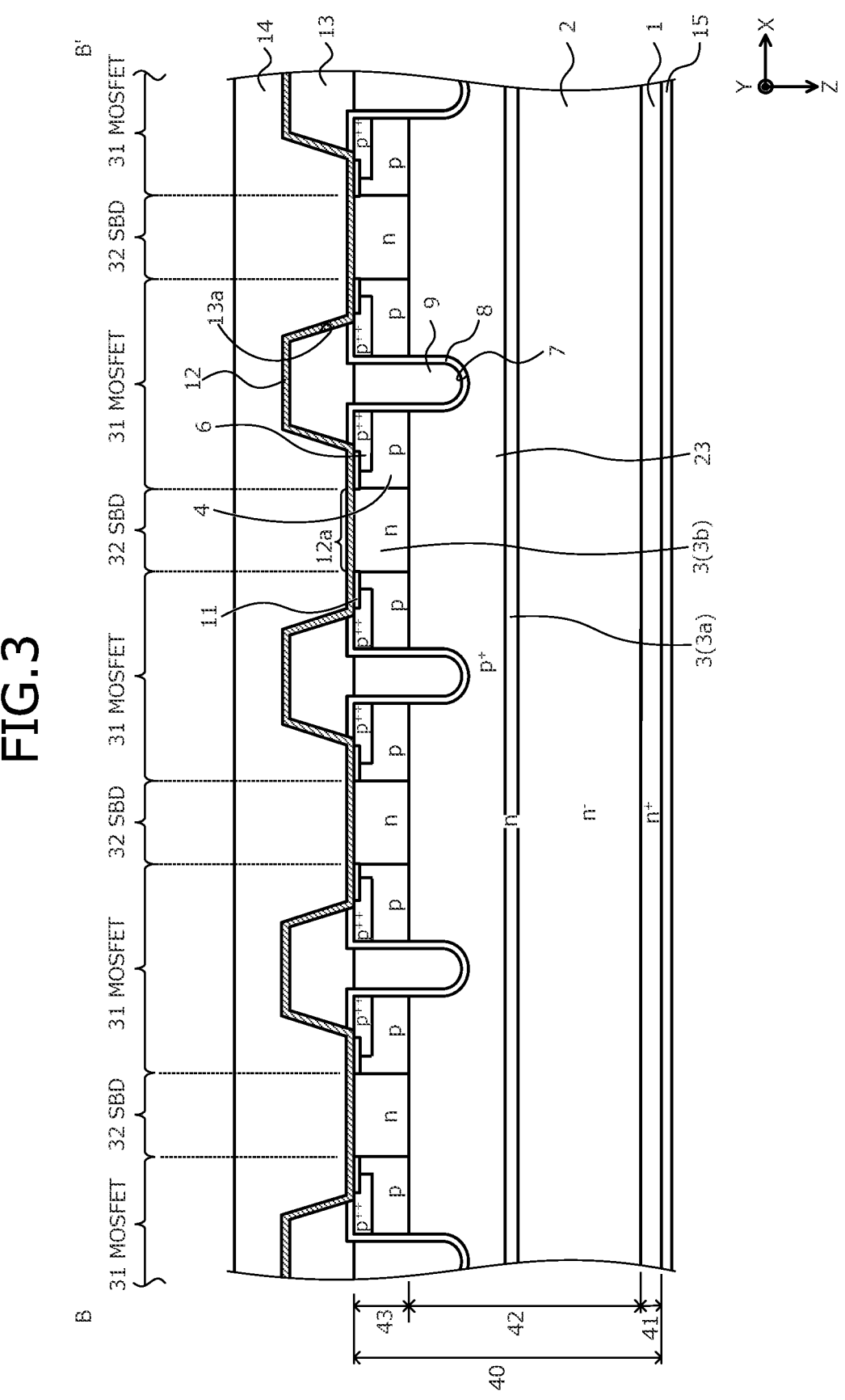
FIG. 3 is a cross-sectional view depicting the structure along cutting line B-B' in FIG. 1.

Further, in FIG. 1, the p$^+$-type regions 21 to 23 are indicated by the same hatching. The gate electrodes 9, the Schottky contact portions 12a of the conductive layer 12, and the p$^{++}$-type contact regions 6 are indicated by respectively different hatching and the p$^+$-type regions 21 to 23 are indicated by different hatching. In FIG. 1, the n$^+$-type source regions 5 are indicated by broken lines and depiction of the gate insulating film 8 is omitted. FIG. 2 is a cross-sectional view depicting the structure along cutting line A-A' in FIG. 1. FIG. 3 is a cross-sectional view depicting the structure along cutting line B-B' in FIG. 1.

A silicon carbide semiconductor device 10 according to the first embodiment depicted in FIG. 1 is the vertical trench gate MOSFETs 31 in which, on a front surface of a semiconductor substrate (semiconductor chip) 40 thereof containing silicon carbide, the built-in SBDs (planar SBDs) 32 are disposed in a flat plate-like shape. Unit cells of the MOSFETs 31 (functional units of a device element) and unit cells of the planar SBDs 32 are disposed to alternate one another in the first direction X that is parallel to the front surface of the semiconductor substrate 40, in an active region 51. The active region 51 is a region through which a main current (drift current) flows when the MOSFETs are ON and in which the respective unit cells of the MOSFETs 31 and the planar SBDs 32 are disposed in plural.

An edge termination region 52 is a region between the active region 51 and an end (chip end) of the semiconductor substrate 40, the edge termination region 52 surrounds a periphery of the active region 51 in a plan view thereof. The edge termination region 52 has a function of mitigating electric field of a front side of the semiconductor substrate 40 and sustaining a withstand voltage. The withstand voltage is a voltage limit at which no malfunction or destruction of the silicon carbide semiconductor device 10 occurs. In the edge termination region 52, a voltage withstanding structure such as a field limiting ring (FLR), a junction termination extension (JTE) structure, etc. is disposed.

The trenches (gate trenches) 7 in which the MOS gates of the MOSFETs 31 are embedded are disposed in plural at a predetermined interval in the first direction X. The gate trenches 7 extend in a striped pattern in the second direction Y that is parallel to the front surface of the semiconductor substrate 40 and orthogonal to the first direction X. Each adjacent two of the gate trenches 7 has disposed therebetween both the MOSFET 31 and the planar SBD 32, extending linearly in the second direction Y parallel to the gate trenches 7. Between each adjacent two of the gate trenches 7, the planar SBD 32 is disposed at a position further from the gate trenches 7 than are the MOSFETs 31.

The p-type base regions (second semiconductor regions) 4 (not depicted in FIG. 1, refer to FIGS. 2 and 3), the n$^+$-type source regions 5, and the p$^{++}$-type contact regions 6 of the MOSFETs 31 are disposed at positions adjacent to the gate trenches 7. The p-type base regions 4 extend linearly in the second direction Y, parallel to the gate trenches 7. Ends of the p-type base regions 4 adjacent to one another (the ends in longitudinal direction (the second direction Y) of the p-type base regions 4) are connected to one another close to a border between the active region 51 and the edge termination region 52. Connected portions of the ends of the p-type base regions 4 in the longitudinal direction extend along the border between the active region 51 and the edge termination region 52 and thereby, surround the periphery of the active region 51.

The n$^+$-type source regions 5 and the p$^{++}$-type contact regions 6 are disposed along the gate trenches 7, repeatedly alternating one another in the second direction Y. The $p^{++}$-type contact regions 6 are scattered in the second direction Y and are scattered in the first direction X, sandwiching the gate trenches 7. A width of each of the $p^{++}$-type contact regions 6 in the second direction Y may be narrower than a width of the $n^+$-type source regions 5 in the second direction Y. FIG. 1 depicts an instance in which the $p^{++}$-type contact regions 6 have a substantially square shape in a plan view, and between each adjacent two of the $p^{++}$-type contact regions 6 adjacent to each another in the second direction Y, one of the $n^+$-type source regions 5 having a substantially rectangular shape longer in the second direction Y in a plan view is disposed adjacent to each of the adjacent two of the $p^{++}$-type contact regions 6.

The $p^+$-type regions 21 to 23 described hereinafter constitute a single $p^+$-type region having a lattice-like shape in a plan view. The $p^+$-type regions 21, 22 are disposed repeatedly alternating one another in the first direction X and extend linearly, parallel to the gate trenches 7 in the second direction Y. The $p^+$-type regions 21 face the bottoms of the gate trenches 7 in a depth direction Z, respectively. The depth direction Z is a direction from the front surface of the semiconductor substrate 40 to back surface thereof. A width of the $p^+$-type regions 21 in a transverse direction thereof (the first direction X), for example, is wider than a width of the gate trenches 7 in a transverse direction thereof (the first direction X). The $p^+$-type regions 21 terminate closer to the chip end in the longitudinal direction (the second direction Y) than do the gate trenches 7.

The $p^+$-type regions 21, 22, for example, terminate at substantially a same position in the longitudinal direction. Substantially a same position means a same position within a range that includes allowable error due to processing variation. The $p^+$-type regions 22 face the Schottky contact portions 12a of the conductive layer 12 in the depth direction Z, respectively. A width of the $p^+$-type regions 22 in a transverse direction thereof (the first direction X), for example, is wider than a width of the Schottky contact portions 12a of the conductive layer 12 in a transverse direction thereof (the first direction X). The $p^+$-type regions 23 face the $p^{++}$-type contact regions 6 in the depth direction Z. The $p^+$-type regions 23 extend in a striped pattern in the first direction X and are connected to the $p^+$-type regions 21, 22 at portions where the $p^+$-type regions 23 intersect the $p^+$-type regions 21, 22.

In substantially a center between each adjacent two of the gate trenches 7, a later-described n-type current spreading region (first semiconductor region) 3 (not depicted in FIG. 1, refer to FIGS. 2 and 3) is exposed at the front surface of the semiconductor substrate 40 (in an instance in which the n-type current spreading region 3 is omitted, a later-described an $n^-$-type drift region (first semiconductor region) 2 is exposed). The n-type current spreading region 3 being exposed at the front surface of the semiconductor substrate 40 means being in contact with the conductive layer 12 at the front surface of the semiconductor substrate 40. Between each adjacent two of the gate trenches 7, the n-type current spreading region 3 is disposed adjacent to the p-type base regions 4, at a position further from the gate trenches 7 than are the p-type base regions 4, the n-type current spreading region 3 extending linearly parallel to the gate trenches 7, in the second direction Y.

Between each adjacent two of the gate trenches 7, the n-type current spreading region 3 forms a Schottky contact with the conductive layer 12 on the front surface of the semiconductor substrate 40. The Schottky contact portions 12a of the conductive layer 12 extend linearly in the second direction Y, parallel to the gate trenches 7. Ends of the Schottky contact portions 12a of the conductive layer 12 in the longitudinal direction (the second direction Y) may terminate closer to a center of the semiconductor substrate 40 (chip center) than do ends of the gate trenches 7 in the longitudinal direction. The planar SBDs 32, which utilize a rectifying property of a Schottky contact formed at junction surfaces of the n-type current spreading region 3 and the conductive layer 12 (the Schottky contact portions 12a of the conductive layer 12), are configured.

The planar SBDs 32 operate concurrently with the MOSFETs 31 when the MOSFETs 31 are ON and exhibit static properties of a same degree as that of a body diode of the MOSFETs 31. Body diodes of the MOSFETs 31 are parasitic pin diodes formed by pn junctions (refer to FIGS. 2 and 3) between the $p^{++}$-type contact regions 6, the p-type base regions 4, the $p^+$-type regions 21 to 23, the n-type current spreading region 3, the $n^-$-type drift region 2, and an $n^+$-type drain region 1. The planar SBDs 32 have lower forward voltage than that of the body diodes of the MOSFETs 31, preferentially operate when the MOSFETs 31 are OFF, and have a function of suppressing degradation of forward characteristics of the body diodes of the MOSFETs 31.

Next, a cross-section of the structure of the silicon carbide semiconductor device 10 according to the first embodiment is described. The semiconductor substrate 40 is formed by sequentially forming by epitaxial growth on a front surface of an $n^+$-type starting substrate 41, epitaxial layers (first and second epitaxial layers) 42, 43 constituting the $n^-$-type drift region 2 and the p-type base regions 4. A main surface of a front side of the semiconductor substrate 40 including the p-type epitaxial layer 43 is assumed to be a front surface while a main surface of a back side of the semiconductor substrate 40 including the $n^+$-type starting substrate 41 is assumed to be a back surface. In the active region 51, the trench gate structure of the MOSFETs 31 is provided in the front side of the semiconductor substrate 40, and the planar SBDs 32 are provided in a flat plate-like shape on the front surface of the semiconductor substrate 40.

The trench gate structure of the MOSFETs 31 is configured by the p-type base regions 4, the $n^+$-type source regions 5, the $p^{++}$-type contact regions 6, the gate trenches 7, the gate insulating film 8, and the gate electrodes 9. The $n^+$-type starting substrate 41 functions as the $n^+$-type drain region 1. The $n^-$-type drift region 2 is a portion of the $n^-$-type epitaxial layer 42 excluding the later-described $p^+$-type regions 21 to 23 and the later-described n-type current spreading region 3, and is provided between and in contact with the $n^+$-type starting substrate 41, the $p^+$-type regions 21 to 23, and the n-type current spreading region 3. The p-type base regions 4 are provided between the front surface of the semiconductor substrate 40 and the $n^-$-type drift region 2.

The p-type base regions 4 are portions of the p-type epitaxial layer 43 excluding the $n^+$-type source regions 5 and the $p^{++}$-type contact regions 6. The $n^+$-type source regions 5 and the $p^{++}$-type contact regions 6 are selectively provided between the front surface of the semiconductor substrate 40 and the p-type base regions 4, are in contact with the p-type base regions 4, and are exposed at the front surface of the semiconductor substrate 40. The $n^+$-type source regions 5 and the $p^{++}$-type contact regions 6 being exposed at the front surface of the semiconductor substrate 40 means that the $n^+$-type source regions 5 and the $p^{++}$-type contact regions 6 are in contact with a later-described conductive layer (first conductive film) 11, at the front surface of the semiconductor substrate 40.

The $n^+$-type source regions 5 and the $p^{++}$-type contact regions 6, as described above, are adjacent to one another in the second direction Y. The $n^+$-type source regions 5 and the $p^{++}$-type contact regions 6 are in contact with the gate insulating film 8, at sidewalls of the gate trenches 7. The $p^{++}$-type contact regions 6 may be disposed apart from the gate trenches 7. The p-type base regions 4 may be exposed at the front surface of the semiconductor substrate 40, at a location further from the gate trenches 7 than are the $n^+$-type source regions 5 and the $p^{++}$-type contact regions 6. The $p^{++}$-type contact regions 6 may be omitted and instead of the $p^{++}$-type contact regions 6, the p-type base regions 4 may be exposed at the front surface of the semiconductor substrate 40.

The n-type current spreading region 3 is provided between the $n^-$-type drift region 2 and the p-type base regions 4, in contact with the $n^-$-type drift region 2 and the p-type base regions 4. The n-type current spreading region 3 is a so-called current spreading layer (CSL) that reduces carrier spreading resistance. The n-type current spreading region 3, between each adjacent two of the gate trenches 7, has a first portion 3a that is closer to the $n^+$-type drain region 1 than are the p-type base regions 4, the first portion 3a reaching the sidewalls of the gate trenches 7 in the first direction X and reaching a position closer to the $n^+$-type drain region 1 in the depth direction Z than are the bottoms of the gate trenches 7.

Further, in substantially the center between each adjacent two of the gate trenches 7, the n-type current spreading region 3 reaches the front surface of the semiconductor substrate 40 and is exposed at the front surface of the semiconductor substrate 40. Surface regions (hereinafter, second portions) 3b of the n-type current spreading region 3, reaching the front surface of the semiconductor substrate 40 are adjacent to the p-type base regions 4 in a direction parallel to the front surface of the semiconductor substrate 40 and surround peripheries of the p-type base regions 4. In other words, between each adjacent two of the gate trenches 7, in a surface region (at the front surface) of the semiconductor substrate 40, a respective one of the second portions 3b of the n-type current spreading region 3 is disposed in substantially the center of the adjacent two of the gate trenches 7, and the p-type base regions 4 are disposed between the respective one of the second portions 3b and the adjacent two of the gate trenches 7.

Figures 21, 22:
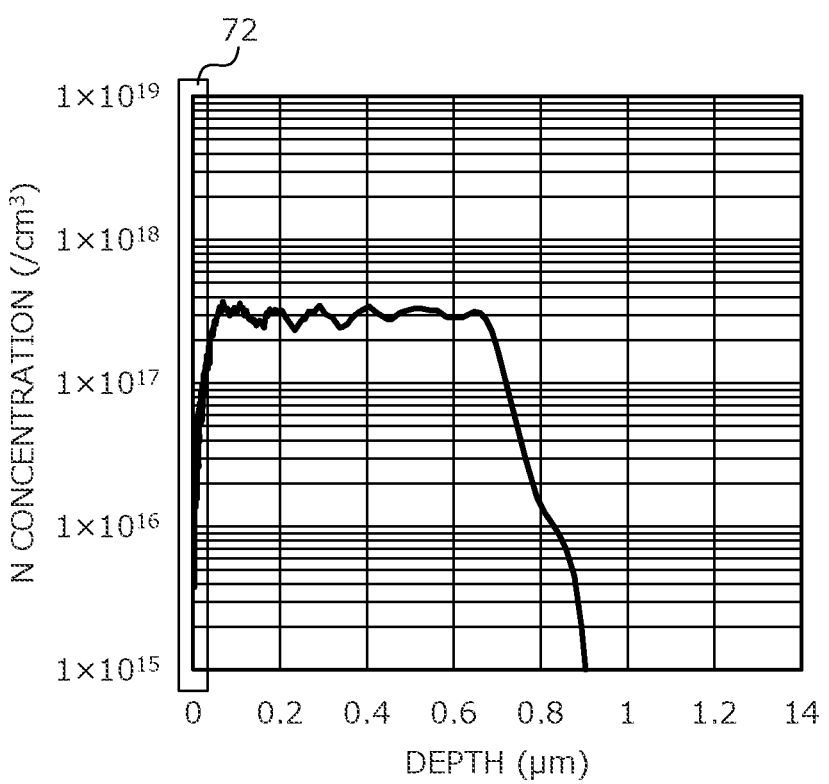
FIG. 21 is a distribution diagram showing n-type doping concentration distribution of the second portions 3b of the n-type current spreading regions in FIG. 20.
FIG. 22 is a table showing ion implantation conditions for an n-type impurity (nitrogen) in a first example.

An impurity concentration of the second portions 3b of the n-type current spreading region 3 in the depth direction Z from the front surface of the semiconductor substrate 40 exhibits a substantially uniform box profile (refer to FIG. 21). A substantially uniform impurity concentration means the same impurity concentration within a range that includes allowable error due to process variation. The n-type current spreading region 3 may be omitted. In this instance, the p-type base regions 4 and the $n^-$-type drift region 2 are in contact with each other and instead of the second portions 3b of the n-type current spreading region 3, the $n^-$-type drift region 2 is exposed at the front surface of the semiconductor substrate 40. Herein, while an instance in which the n-type current spreading region 3 is provided is described an example, in an instance in which the n-type current spreading region 3 is omitted, the n-type current spreading region 3 suffices to be read as the $n^-$-type drift region 2.

Between the $n^-$-type drift region 2 and the p-type base regions 4, the $p^+$-type regions 21 to 23 are selectively provided in contact with the n-type current spreading region 3. The $p^+$-type regions 21 to 23 may reach positions closer to the $n^+$-type drain region 1 than are the bottoms of the gate trenches 7. Therefore, the $p^+$-type regions 21 to 23 may terminate at positions further from the $n^+$-type drain region 1 than is the n-type current spreading region 3 and peripheries of the $p^+$-type regions 21 to 23 may be surrounded by the n-type current spreading region 3. The $p^+$-type regions 21 to 23 may terminate at the same depth as that of the n-type current spreading region 3 on the $n^+$-type drain region 1 side or may reach positions closer to the $n^+$-type drain region 1 than is the n-type current spreading region 3 and be in contact with the $n^-$-type drift region 2.

The $p^+$-type regions 21 to 23 are electrically connected to a later-described front electrode (first electrode) 14, are depleted when the MOSFETs 31 are OFF, and have a function of mitigating electric field applied to the bottoms of the gate trenches 7. The $p^+$-type regions 21 (refer to FIG. 2) are provided apart from the p-type base regions 4 and face the bottoms of the gate trenches 7 in the depth direction Z. The $p^+$-type regions 21 may be exposed at the bottoms of the gate trenches 7. Being exposed at the bottoms of the gate trenches 7 means being in contact with the gate insulating film 8 at the bottoms of the gate trenches 7. The $p^+$-type regions 22 (refer to FIG. 2), between each adjacent two of the gate trenches 7, are provided apart from the p-type base regions 4 and the $p^+$-type regions 21.

The $p^+$-type regions 22 face the Schottky contact portions 12a of the conductive layer 12 in the depth direction Z. The $p^+$-type regions 21, 22, as described hereinafter, are formed concurrently by ion implantation into the $n^-$-type epitaxial layer 42 and are provided at substantially a same depth and having substantially a same thickness. Substantially the same depth and substantially the same thickness means the same depth and the same thickness within a range that includes allowable error due to process variation. A portion (facing the $n^+$-type drain region 1) of each of the $p^+$-type regions 23, as described hereinafter, is formed concurrently with the $p^+$-type regions 21, 22 by the ion implantation into the $n^-$-type epitaxial layer 42 and reaches substantially the same depth as the $p^+$-type regions 21, 22.

The $p^+$-type regions 23 (refer to FIG. 3), between each adjacent two of the gate trenches 7, are provided at positions facing the $p^{++}$-type contact regions 6 in the depth direction Z, extend in the first direction X, and reach the gate trenches 7. The $p^+$-type regions 23 are in contact with the p-type base regions 4 and the second portions 3b of the n-type current spreading region 3. Portions between each adjacent two of the $p^+$-type regions 23 in the second direction Y constitute the first portions 3a of the n-type current spreading region 3. Thus, at positions facing the $n^+$-type source regions 5 in the depth direction Z, the first portions 3a of the n-type current spreading region 3 are in contact with the p-type base regions 4 and the second portions 3b of the n-type current spreading region 3.

The $p^+$-type regions 21, 22 are connected to each other by the $p^+$-type regions 23, whereby the $p^+$-type regions 21 to 23 are fixed to a same potential (potential of the front electrode 14). The gate trenches 7 penetrate through the $n^+$-type source regions 5, the $p^{++}$-type contact regions 6, and the p-type base regions 4 in the depth direction Z and reach the n-type current spreading region 3. In the gate trenches 7, the gate electrodes 9 are provided, via the gate insulating film 8. The MOS gates of the trench gate structure of the MOSFETs 31 are configured by the gate trenches 7, the gate insulating film 8, and the gate electrodes 9. One unit cell of the MOSFETs 31 is configured by adjacent portions of the p-type base regions 4, sandwiching one of the gate trenches 7 in the first direction X.

One unit cell of the planar SBDs 32 is configured by one of the Schottky contact portions 12a of the conductive layer 12. Thus, between each adjacent two of the gate trenches 7, one of the planar SBDs 32 and the MOSFETs 31 adjacent on both sides of the planar SBD 32 in the first direction X are disposed. Of the pn junctions forming the body diodes of the MOSFETs 31, a pn junction for which a distance d1 from the planar SBD 32 is longest is a pn junction between one of the p$^+$-type regions 21 directly beneath the gate trenches 7 and the n-type current spreading region 3, and the distance d1 between one of the pn junctions forming the body diodes of the MOSFETs 31 and one of the planar SBDs 32 is shorter compared to a conventional structure (refer to reference character d101 in FIG. 26). Configuration between each adjacent two of the gate trenches 7 is the same.

An interlayer insulating film 13 is provided in an entire area of the front surface of the semiconductor substrate 40 and covers the gate electrodes 9. In contact holes 13a of the interlayer insulating film 13, a conductive layer (first conducting film) 11 is selectively provided on the front surface of the semiconductor substrate 40. The conductive layer 11 is provided only on the n$^+$-type source regions 5 and the p$^{++}$-type contact regions 6 and, for example, is a nickel silicide (NixSiy, where x, y are positive numbers) film in ohmic contact with the n$^+$-type source regions 5 and the p$^{++}$-type contact regions 6. When the p-type base regions 4 are exposed at the front surface of the semiconductor substrate 40, the conductive layer 11 may extend onto the p-type base regions 4.

The conductive layer 12 covers an entire surface of the interlayer insulating film 13 and in the contact holes 13a, extends onto the front surface of the semiconductor substrate 40; the conductive layer 12 covers the conductive layer 11 and the second portions 3b of the n-type current spreading region 3. The conductive layer 12, for example, is a titanium (Ti) film. The conductive layer 12, for example, has a portion on the interlayer insulating film 13, functioning as barrier metal that prevents diffusion of metal atoms from the front electrode 14 to the gate electrodes 9. Further, the conductive layer 12 forms a Schottky contact with the second portions 3b of the n-type current spreading region 3, in the contact holes 13a of the interlayer insulating film 13. The planar SBDs 32 are configured by the Schottky contact portions 12a of the conductive layer 12.

The planar SBDs 32 share the n-type current spreading region 3, the n$^-$-type drift region 2, and the n$^+$-type drain region 1 with the MOSFETs 31. Potential of the on junctions of the body diodes of the MOSFETs 31 is about equal to potential of the Schottky contact portions 12a of the conductive layer 12. The front electrode 14 is provided on the front surface of the semiconductor substrate 40 so as to be embedded in the contact holes 13a. The front electrode 14 is electrically connected to the p-type base regions 4, the n$^+$-type source regions 5, and the p$^{++}$-type contact regions 6, via the conductive layer 11. The front electrode 14 and the conductive layer 11 function as a source electrode of the MOSFETs 31.

The front electrode 14 is electrically connected to the n-type current spreading region 3 and the n$^-$-type drift region 2, via the conductive layer 12. The front electrode 14 also serves as an anode electrode of the planar SBDs 32. The conductive layer 12 functions as an anode electrode of the planar SBDs 32. A back electrode (second electrode) 15 is provided in an entire area of the back surface (back surface of the n$^+$-type starting substrate 41) of the semiconductor substrate 40. The back electrode 15 is electrically connected to the n$^+$-type starting substrate 41. The back electrode 15 also functions as a drain electrode of the MOSFETs 31. The back electrode 15 further serves as a cathode electrode of the planar SBDs 32.

Next, operation of the silicon carbide semiconductor device 10 according to the first embodiment is described. When voltage (drain-source voltage) that is positive with respect to the front electrode 14 is applied to the back electrode 15 and gate voltage that is at least equal to a gate threshold voltage is applied to the gate electrodes 9, a channel (n-type inversion layer) is formed in portions of the p-type base regions 4 along the gate trenches 7. As a result, drain-source current flows from the n$^+$-type drain region 1, through the n$^-$-type drift region 2, the n-type current spreading region 3, and the channel, to the n$^+$-type source regions 5, and the MOSFETs 31 turn ON.

On the other hand, when voltage that is positive with respect to the front electrode 14 is applied to the back electrode 15 and gate voltage that is less than the gate threshold voltage is applied to the gate electrodes 9, the pn junctions between the p$^{++}$-type contact regions 6, the p$^+$-type regions 21 to 23, the p-type base regions 4, the n-type current spreading region 3, the n-type current spreading region 3, the n$^-$-type drift region 2, and the n$^+$-type drain region 1 are reverse biased, whereby flow of the drain-source current stops and the MOSFETs 31 maintain an OFF state. A depletion layer spreads from the pn junctions and electric field applied to the gate insulating film 8 at the bottoms of the gate trenches 7 is mitigated.

Further, when the MOSFETs 31 are OFF and voltage (forward voltage of the body diodes of the MOSFETs 31 and the planar SBDs 32) that is negative with respect to the front electrode 14 is applied to the back electrode 15, the planar SBDs 32, for which the forward voltage is set lower than that of the body diodes of the MOSFETs 31, conducts sooner than the body diodes of the MOSFETs 31 due to a Schottky barrier that is determined by electrical properties of the conductive layer 12 and formed at junction surfaces between the conductive layer 12 and the second portions 3b of the n-type current spreading region 3. Thus, the body diodes of the MOSFETs 31 do not operate. Therefore, degradation of forward characteristics of the body diodes of the MOSFETs 31 is suppressed.

Figure 11:
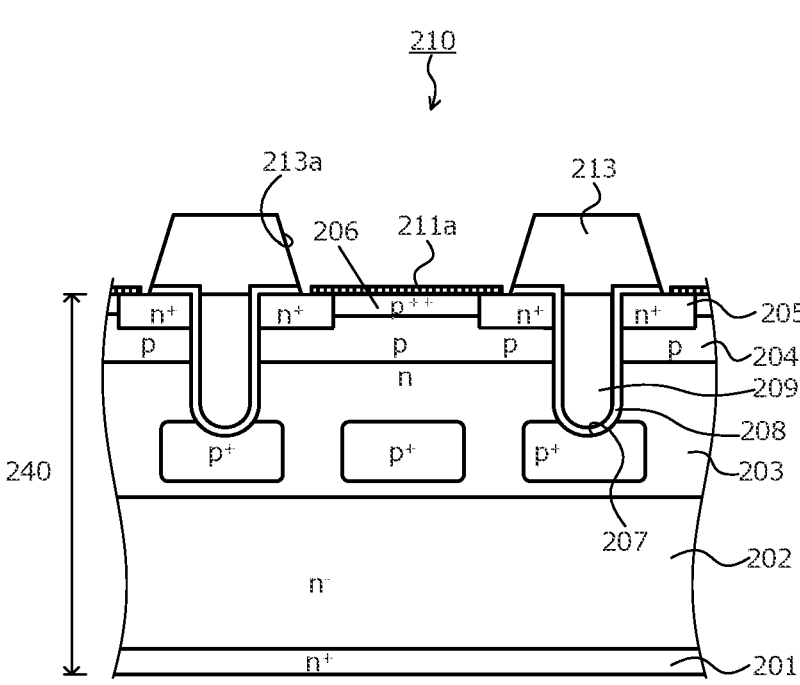
FIG. 11 is a cross-sectional view of a state of a comparison example during manufacture.
Figure 12:
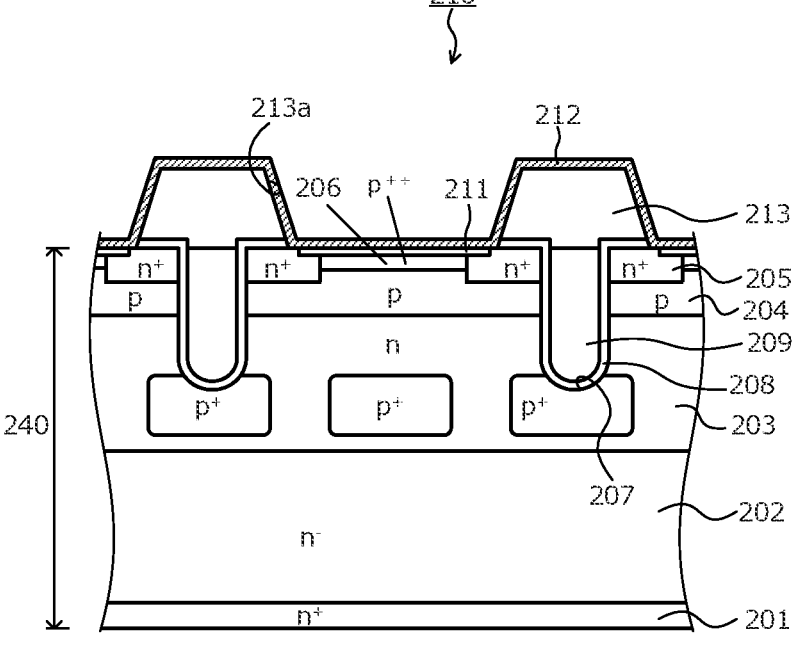
FIG. 12 is a cross-sectional view of a state of the comparison example during manufacture.

Next, a method of manufacturing the silicon carbide semiconductor device 10 according to the first embodiment is described. FIGS. 4, 5, 6, 7, 8, 9, and 10 are cross-sectional views of states of the silicon carbide semiconductor device according to the first embodiment during manufacture. FIGS. 4 to 10 depict a portion of FIG. 2. FIGS. 11 and 12 are cross-sectional views of states of a comparison example during manufacture. FIGS. 11 and 12, as a comparison example, depict a method of forming conductive layers 211, 212 of a typical MOSFET 210 without a built-in SBD.

Figure 4:
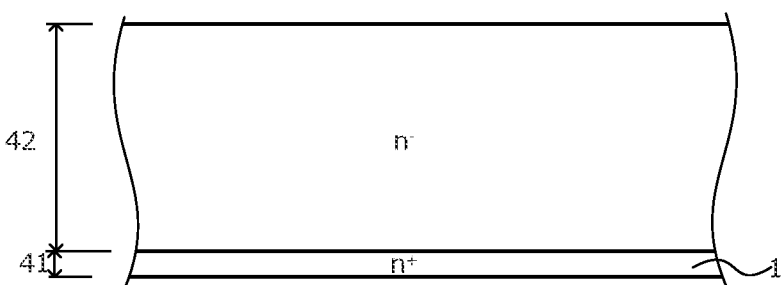
FIG. 4 is a cross-sectional view of a state of the silicon carbide semiconductor device according to the first embodiment during manufacture.

First, as depicted in FIG. 4, the n$^+$-type starting substrate (starting wafer) 41 containing silicon carbide is prepared. The n$^+$-type starting substrate 41 constitutes the n$^+$-type drain region 1 of the MOSFETs 31. Next, on the front surface of the n$^+$-type starting substrate 41, the n$^-$-type epitaxial layer 42 is epitaxially grown having a thickness that is thinner than a product thickness (thickness of the first portions 3a of the n-type current spreading region 3) of the n$^-$-type epitaxial layer 42 after product (the silicon carbide semiconductor device 10) completion.

Figure 5:
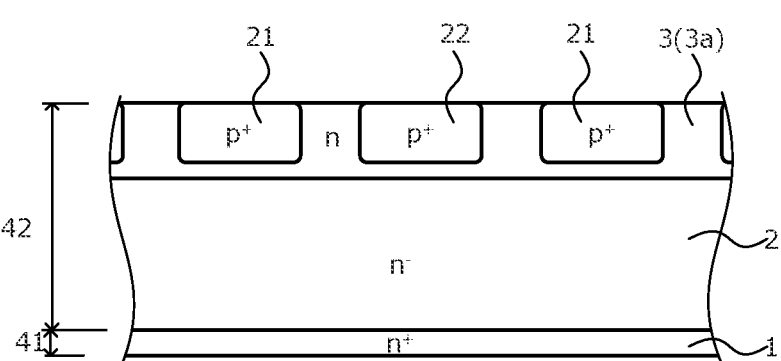
FIG. 5 is a cross-sectional view of a state of the silicon carbide semiconductor device according to the first embodiment during manufacture.

Next, as depicted in FIG. 5, the p$^+$-type regions 21 to 23 are selectively formed in surface regions of the n$^-$-type epitaxial layer 42 by photolithography and ion implantation of a p-type impurity (refer to FIGS. 1 to 3). Next, an ion implantation mask (not depicted) used in the formation of the p$^+$-type regions 21 to 23 is removed and thereafter, by photolithography and ion implantation of an n-type impurity, the first portions 3a of the n-type current spreading region 3 are formed in surface regions of the n⁻-type epitaxial layer 42.

A sequence in which the n-type current spreading region 3 and the p⁺-type regions 21 to 23 are formed may be interchanged. Ion implantation masks used in the formation of the n-type current spreading region 3, the p⁺-type regions 21 to 23, or diffused regions formed by later-described ion implantation, for example, may be an oxide film ($SiO_2$ film) or resist film. A portion of the n⁻-type epitaxial layer 42, free of ion implantation (portion excluding the n-type current spreading region 3 and the p⁺-type regions 21 to 23) constitutes the n⁻-type drift region 2.

Figure 6:
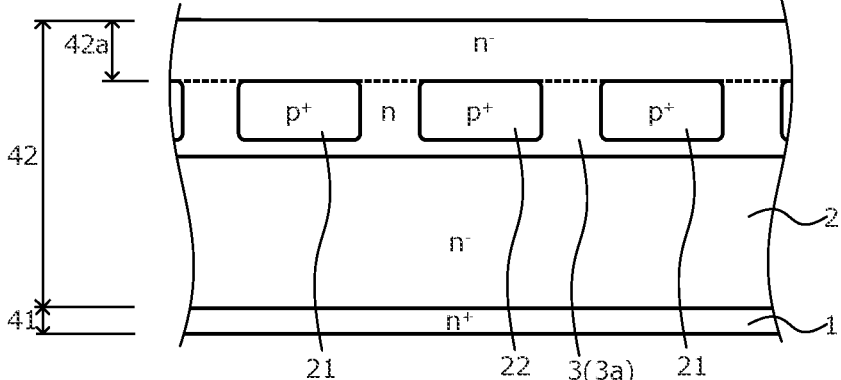
FIG. 6 is a cross-sectional view of a state of the silicon carbide semiconductor device according to the first embodiment during manufacture.

Next, as depicted in FIG. 6, an ion implantation mask (not depicted) used in the formation of the n-type current spreading region 3 is removed and thereafter, an n⁻-type epitaxial layer is further epitaxially grown on the n⁻-type epitaxial layer 42 increasing the thickness to make the n⁻-type epitaxial layer 42 have the product thickness. A portion 42a by which the thickness the n⁻-type epitaxial layer 42 is increased may have an impurity concentration that is, for example, substantially the same as an impurity concentration the n⁻-type drift region 2.

Next, by photolithography and ion implantation of a p-type impurity, the p-type impurity is selectively implanted in the portion 42a by which the thickness of the n⁻-type epitaxial layer 42 is increased, thereby increasing the thickness of the p⁺-type regions 23 (refer to FIG. 3). As a result, a portion (the p⁺-type regions 23) of one of the p⁺-type regions formed by disposing the p⁺-type regions 21 to 23 in a predetermined layout (for example, lattice-like shape in a plan view) is exposed at the surface of the n⁻-type epitaxial layer 42.

Next, an ion implantation mask (not depicted) used in the formation of the p⁺-type regions 23 is removed and thereafter, by photolithography and ion implantation of an n-type impurity, the n-type impurity is implanted in the portion 42a that increased the thickness of the n⁻-type epitaxial layer 42, and the thickness of the first portions 3a of the n-type current spreading region 3 is increased. As a result, the first portions 3a of the n-type current spreading region 3 are exposed at the surface of the n⁻-type epitaxial layer 42. A sequence in which the n-type current spreading region 3 and the p⁺-type regions 23 are formed may be interchanged.

Figure 7:
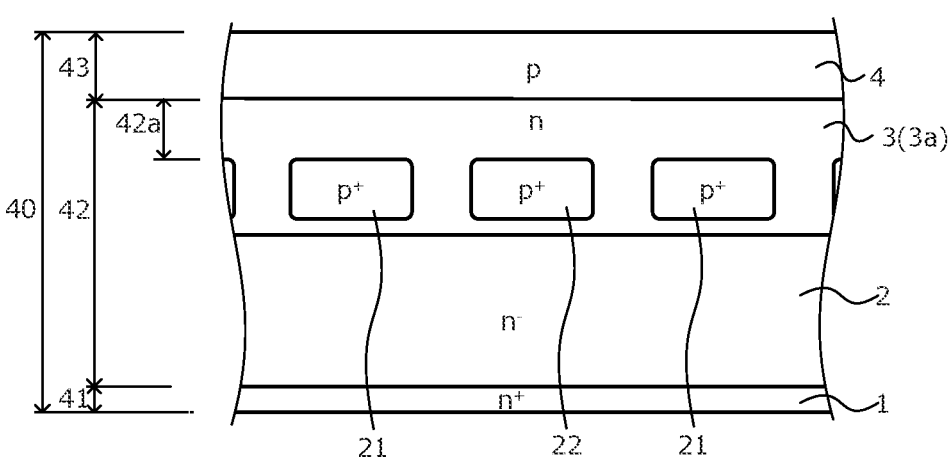
FIG. 7 is a cross-sectional view of a state of the silicon carbide semiconductor device according to the first embodiment during manufacture.

Next, as depicted in FIG. 7, the p-type epitaxial layer 43 is epitaxially grown on the surface of the n⁻-type epitaxial layer 42. As a result, the semiconductor substrate (semiconductor wafer) 40 in which the epitaxial layers 42, 43 are sequentially formed by epitaxial growth on the front surface of the n⁺-type starting substrate 41 is completed. The p-type epitaxial layer 43 is in contact with the first portions 3a of the n-type current spreading region 3 and the p⁺-type regions 23 exposed at the surface of the n⁻-type epitaxial layer 42 beneath the p-type epitaxial layer 43.

Figure 8:
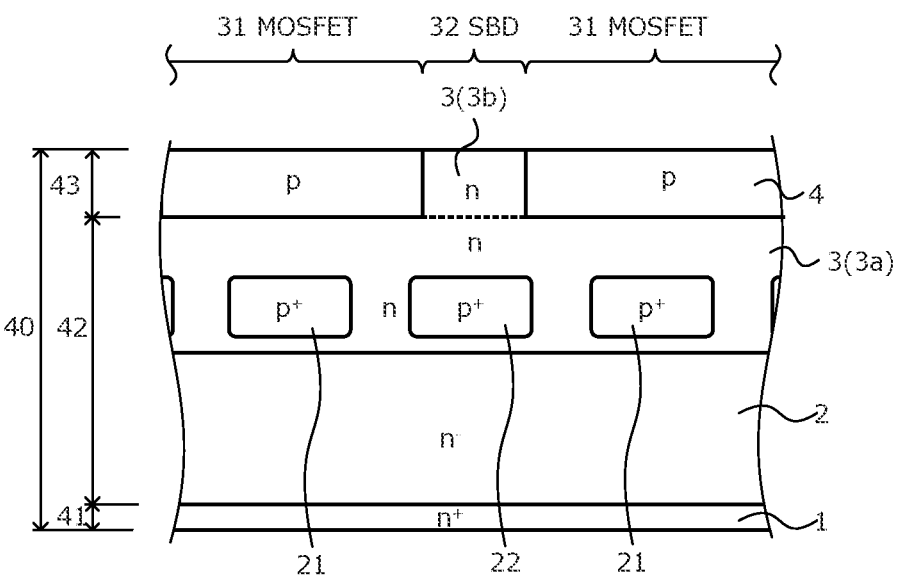
FIG. 8 is a cross-sectional view of a state of the silicon carbide semiconductor device according to the first embodiment during manufacture.

Next, as depicted in FIG. 8, by photolithography and ion implantation of an n-type impurity, at positions facing the first portions 3a of the n-type current spreading region 3 in the depth direction Z, the second portions 3b of the n-type current spreading region 3 are formed to a depth so as to penetrate through the p-type epitaxial layer 43. As a result, the first and second portions 3a, 3b of the n-type current spreading region 3 are connected to one another. Next, an ion implantation mask (not depicted) used in the formation of the second portions 3b of the n-type current spreading region 3 is removed.

Figure 9:
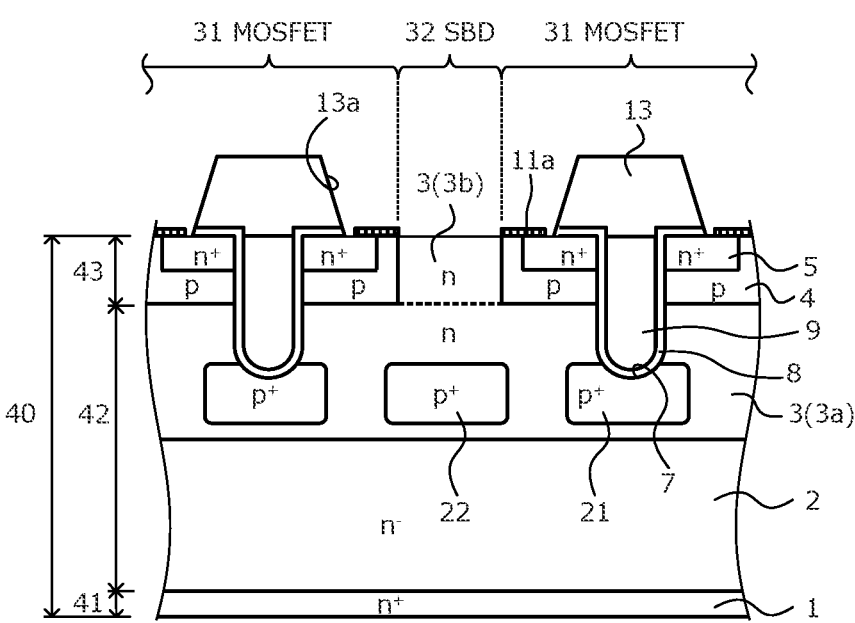
FIG. 9 is a cross-sectional view of a state of the silicon carbide semiconductor device according to the first embodiment during manufacture.

Next, as depicted in FIG. 9, photolithography, ion implantation of an impurity, and ion implantation mask (not depicted) removal are repeatedly performed as one set under different conditions, whereby in the active region 51, the n⁺-type source regions 5 and the p⁺⁺-type contact regions 6 are selectively formed in surface regions of the p-type epitaxial layer 43 (refer to FIG. 3). A sequence in which the second portions 3b of the n-type current spreading region 3, the n⁺-type source regions 5, and the p⁺⁺-type contact regions 6 are formed may be interchanged.

Portions of the p-type epitaxial layer 43 left free of ion implantation and in contact with the p⁺-type regions 23 constitute the p-type base regions 4. Next, by photolithography and etching, at positions facing the p⁺-type regions 21 in the depth direction Z, the gate trenches 7, which penetrate through the n⁺-type source regions 5, the p⁺⁺-type contact regions 6, and the p-type base regions 4 and reach the n-type current spreading region 3 are formed. Subsequently, an etching mask used in the trench formation is removed.

Next, by sacrificial oxidation, a native oxide film on the front surface of the semiconductor substrate 40 and inner walls of the gate trenches 7 is removed. Next, along the front surface of the semiconductor substrate 40 and the inner walls of the gate trenches 7, the gate insulating film 8 is formed. Next, a polysilicon (poly-Si) layer is deposited so that the gate trenches 7 are embedded with a polysilicon, the polysilicon (poly-Si) layer is patterned, and portions of the polysilicon layer constituting the gate electrodes 9 are left in the gate trenches 7.

Next, a patterning mask (not depicted) of the polysilicon layer is removed and thereafter, the interlayer insulating film 13 is deposited on the front surface of the semiconductor substrate 40. Next, by photolithography and etching, the interlayer insulating film 13 is selectively removed, thereby opening the contact holes 13a and exposing the n⁺-type source regions 5, the p⁺⁺-type contact regions 6, and the second portions 3b of the n-type current spreading region 3 in the contact holes 13a.

Next, for example, by a sputtering technique, a nickel film 11a constituting a material film of the conductive layer 11 is deposited on the front surface of the semiconductor substrate 40. Next, by photolithography and etching, the nickel film 11a is selectively removed, leaving only portions thereof on the n⁺-type source regions 5 and the p⁺⁺-type contact regions 6. In an instance in which the p-type base regions 4 are exposed in the contact holes 13a of the interlayer insulating film 13, portions of the nickel film 11a on the p-type base regions 4 may be left.

In other words, in the contact holes 13a of the interlayer insulating film 13, portions of the nickel film 11a on areas where a Schottky contact is formed with the semiconductor substrate 40 are removed while only portions of the nickel film 11a on areas where an ohmic contact is formed with the semiconductor substrate 40 are left. Next, by a heat treatment, the nickel film 11a is caused to react with the semiconductor substrate 40 and thereby, form a silicide, whereby the conductive layer 11 in ohmic contact with the n⁺-type source regions 5 and the p⁺⁺-type contact regions 6 is formed.

The nickel film 11a constituting the material film of the conductive layer 11 may be selectively removed so as to be apart from the interlayer insulating film 13 and the gate insulating film 8. As a result, when the nickel film 11a forms a silicide, diffusion of nickel atoms from the nickel film 11a to the interlayer insulating film 13 may be prevented. When portions of the nickel film 11a do not form a silicide and remain unreacted on the surface of the conductive layer 11, these unreacted portions of the nickel film 11a may be removed by etching.

Figure 10:
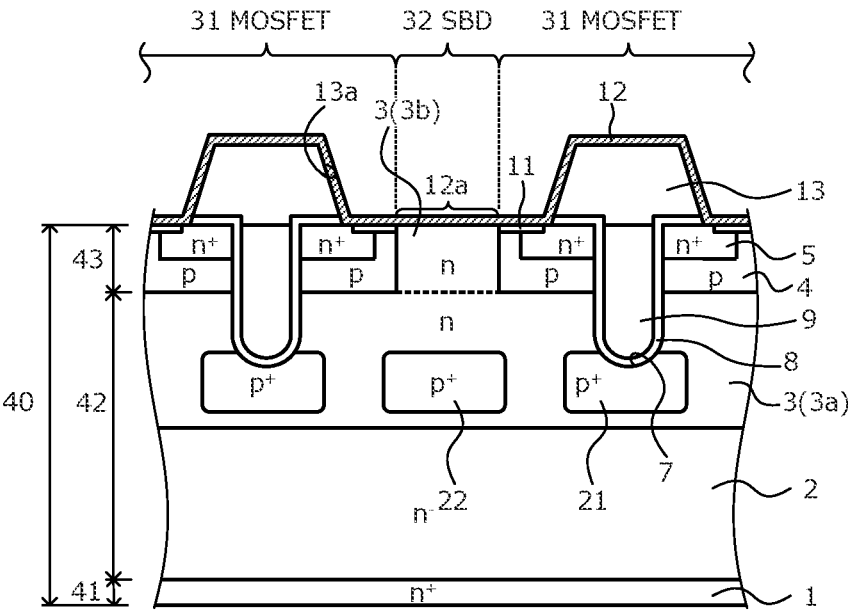
FIG. 10 is a cross-sectional view of a state of the silicon carbide semiconductor device according to the first embodiment during manufacture.

Next, as depicted in FIG. 10, for example, by a sputtering technique, for example, a titanium film constituting the conductive layer 12 is deposited, from the surface of the interlayer insulating film 13, on all the portions of the front surface of the semiconductor substrate 40 exposed in the contact holes 13a of the interlayer insulating film 13. As a result, contact areas of the conductive layer 12 in contact with the second portions 3b of the n-type current spreading region 3 constitute the Schottky contact portions 12a, whereby the planar SBDs 32 are formed.

A portion of the conductive layer 12 excluding the contact areas in contact with the second portions 3b of the n-type current spreading region 3 forms a barrier metal that covers the surface of the interlayer insulating film 13 and the surface of the conductive layer 11. The conductive layers 11, 12 of the silicon carbide semiconductor device 10 according to the first embodiment may be formed by a same method of formation as a method of formation of the conductive layers 211, 212 (a nickel silicide film and barrier metal, refer to FIGS. 11 and 12) of the typical MOSFET 210 without a built-in SBD.

For example, in the typical MOSFET 210, as depicted in FIG. 11, contact holes 213a are formed in an interlayer insulating film 213 and thereafter, a nickel film 211a is deposited on the front surface of the semiconductor substrate 40. Next, the nickel film 211a is selectively removed by photolithography and etching to be left on all portions of a front surface of a semiconductor substrate 240, that are exposed in the contact holes 213a of the interlayer insulating film 213.

Next, by a heat treatment, the nickel film 211a is caused to react with the semiconductor substrate 240 and form a silicide, whereby a conductive layer 211 in ohmic contact with all the portions of the semiconductor substrate 240, exposed in the contact holes 213a of the interlayer insulating film 213 is formed. Next, a titanium film (barrier metal) constituting a conductive layer 212 that covers the entire surface of the interlayer insulating film 213 and the entire surface of the conductive layer 211 is formed.

Configuration of the trench gate structure of the typical MOSFET 210 is about the same as that of the trench gate structure of the MOSFETs 31 of the first embodiment except for a slight difference in arrangement of n⁺-type source regions 205 and p⁺⁺-type contact regions 206. In FIGS. 11 and 12, reference numerals 201, 202, 203, 204, 207, 208, and 209 are an n⁺-type drain region, an n⁻-type drift region, an n-type current spreading region, p-type base regions, gate trenches, a gate insulating film, and gate electrodes, respectively.

In this manner, the method of forming the conductive layers 211, 212 of the typical MOSFET 210 and the method of forming the conductive layers 11, 12 of the silicon carbide semiconductor device 10 according to the first embodiment are the same. Therefore, in the first embodiment, using the formation method of the conductive layers 211, 212 of the typical MOSFET 210, the etching mask used to selectively remove the nickel film 11a constituting the material film of the conductive layer 11 is changed, whereby the conductive layers 11, 12 may be formed.

In this manner, after the conductive layer 12 is formed, by a general method, the front electrode 14 is formed on the conductive layer 12 and the back electrode 15 is formed on the back surface of the semiconductor substrate 40. A sequence in which the front electrode 14 and the back electrode 15 are formed may be interchanged. Subsequently, the semiconductor substrate (semiconductor wafer) 40 is diced (cut) into individual chips, whereby the silicon carbide semiconductor device 10 depicted in FIGS. 1 to 3 is completed.

Figure 13:
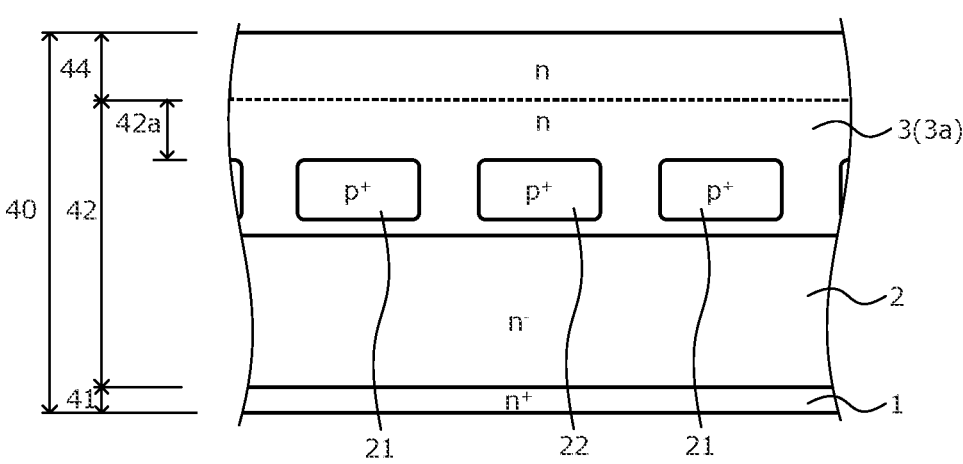
FIG. 13 is a cross-sectional view of another state of the silicon carbide semiconductor device according to the first embodiment during manufacture.
Figure 14:
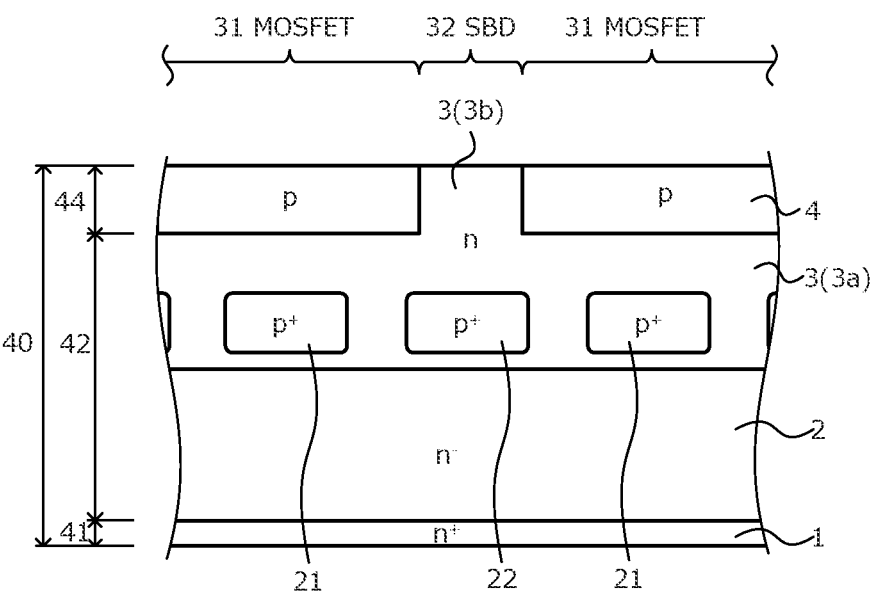
FIG. 14 is a cross-sectional view of another state of the silicon carbide semiconductor device according to the first embodiment during manufacture.

FIGS. 13 and 14 are cross-sectional views of other states of the silicon carbide semiconductor device according to the first embodiment during manufacture. FIGS. 13 and 14 depict a portion of FIG. 2. In the method of manufacturing the silicon carbide semiconductor device 10 according to the first embodiment described above, instead of epitaxially growing the p-type epitaxial layer 43 as an uppermost layer of the semiconductor substrate 40 (refer to FIG. 7), an n-type epitaxial layer (second epitaxial layer) 44 may be epitaxially grown (refer to FIG. 13).

In particular, similarly to the method of manufacturing the silicon carbide semiconductor device 10 according to the first embodiment described above, processes from the preparation of the n⁺-type starting substrate (starting wafer) 41 to the formation of the p⁺-type regions 23 and the first portions 3a of the n-type current spreading region 3 in the portion 42a that increases the thickness of the n⁻-type epitaxial layer 42 are sequentially performed (refer to FIGS. 4 to 6). Next, as depicted in FIG. 13, the n-type epitaxial layer 44 is epitaxially grown on the surface of the n⁻-type epitaxial layer 42.

As a result, the semiconductor substrate (semiconductor wafer) 40 in which the n-type epitaxial layers 42, 44 are sequentially formed on the front surface of the n⁺-type starting substrate 41 is completed. The n-type epitaxial layer 44 is in contact with the p⁺-type regions 23 and the first portions 3a of the n-type current spreading region 3 exposed at the surface of the n⁻-type epitaxial layer 42 beneath the n-type epitaxial layer 44. An impurity concentration of the n-type epitaxial layer 44, for example, is substantially the same as the impurity concentration of the n-type current spreading region 3.

Next, as depicted in FIG. 14, by photolithography and ion implantation of a p-type impurity, at positions facing the p⁺-type regions 23 in the depth direction Z, the p-type base regions 4 are selectively formed to a depth so as to penetrate through the n-type epitaxial layer 44. The p-type base regions 4 have an impurity concentration that exhibits substantially a box profile in the depth direction Z from the front surface of the semiconductor substrate 40 (refer to FIG. 24). As a result, the p-type base regions 4 and the p⁺-type regions 23 therebelow are in contact with each other.

Portions of the n-type epitaxial layer 44 left free of ion implantation (portions excluding the p-type base regions 4) constitute the second portions 3b of the n-type current spreading region 3. Subsequently, similarly to the method of manufacturing the silicon carbide semiconductor device 10 according to the first embodiment described above, the processes of forming the n⁺-type source regions 5 and the p⁺⁺-type contact regions 6 and subsequent processes are sequentially performed (refer to FIGS. 9 and 10), whereby the silicon carbide semiconductor device 10 depicted in FIGS. 1 to 3 is completed.

As described above, according to the first embodiment, in the trench gate MOSFET, unit cells of the MOSFETs and unit cells of the planar SBDs are both disposed between gate trenches that are identical and adjacent to one another. As a result, unit cells of the MOSFETs are disposed between each adjacent two of the gate trenches and thus, the planar SBDs may be built into a single semiconductor substrate having the MOSFETs while maintaining the density of the MOSFETs. Due to the built-in planar SBDs, degradation of forward characteristics of the body diodes of the MOSFETs is suppressed.

Further, according to the first embodiment, both unit cells of the MOSFETs and unit cells of the planar SBDs are disposed between gate trenches that are identical and adjacent to one another, whereby a structure results in which unit cells of the MOSFETs and unit cells of the planar SBDs are adjacent to and in direct contact with each other. Therefore, compared to the conventional structure in which the unit cells of the MOSFETs are adjacent to the unit cells of the planar SBDs with the gate trenches intervening therebetween (refer to FIG. 26), the distance between the body diodes of the MOSFETs and the planar SBDs decreases and conduction of the body diodes of the MOSFET may be inhibited more than in the conventional structure.

Further, for example, in an instance in which trench-type SBDs in which SBDs are embedded in trenches (hereinafter, Schottky trenches) are built into a single semiconductor substrate having the MOSFETs, a problem arises in that the Schottky trenches cannot be completely embedded with the conductive layer, whereby voids occur in the Schottky trenches and manufacturing processes become complicated. On the other hand, according to the first embodiment, the planar SBDs are built into a single semiconductor substrate having the MOSFETs, whereby the problems due to the Schottky trenches described above do not occur and processes may be simplified compared to the trench-type SBDs.

Figure 15:
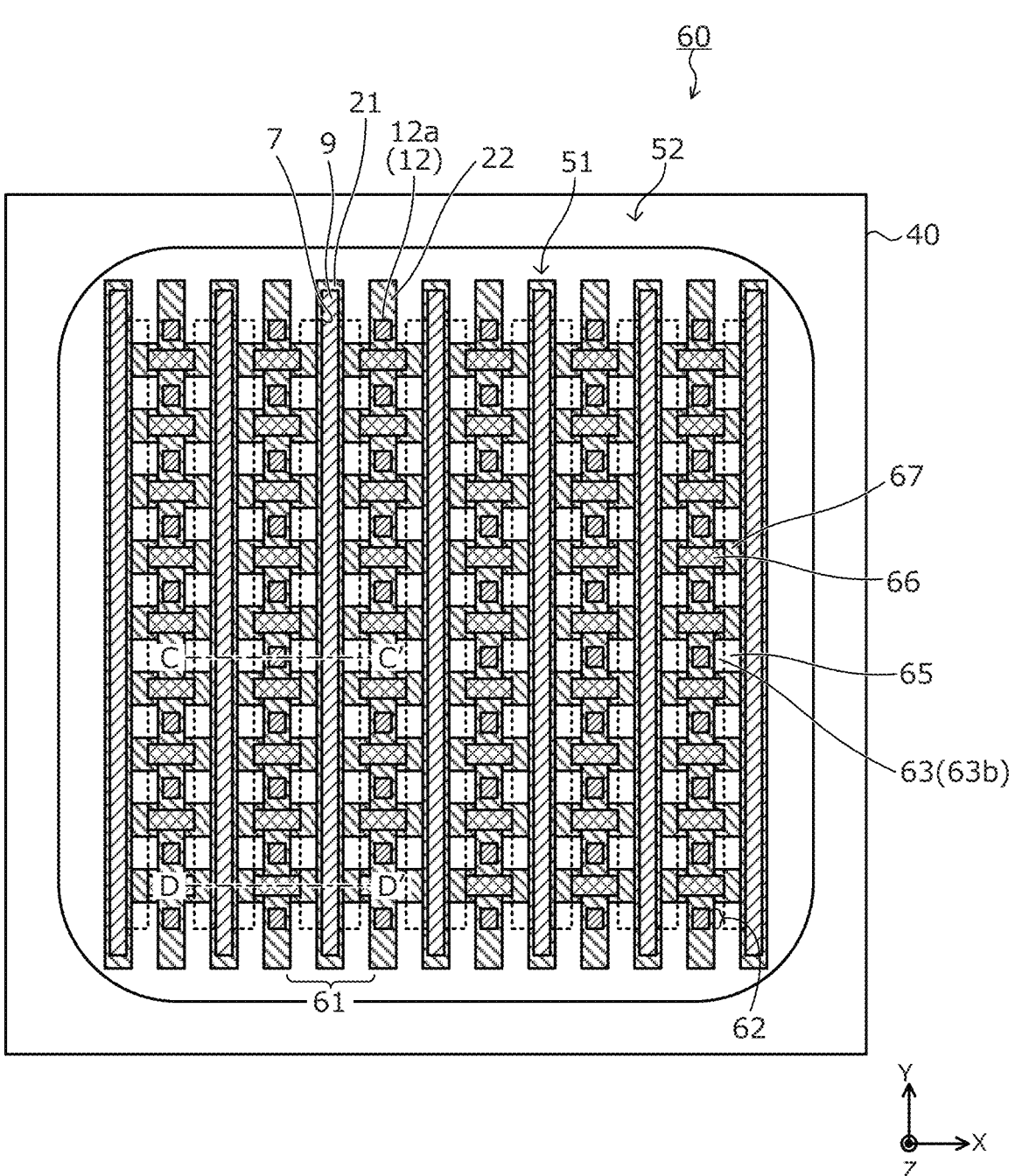
FIG. 15 is a plan view depicting a layout when a silicon carbide semiconductor device according to a second embodiment is viewed from the front side of the semiconductor substrate thereof.

Next, a structure of a silicon carbide semiconductor device according to a second embodiment is described. FIG. 15 is a plan view depicting a layout when the silicon carbide semiconductor device according to the second embodiment is viewed from the front side of the semiconductor substrate thereof. FIG. 15 depicts a layout of MOS gates of MOSFETs 61, planar SBDs 62 (Schottky contact portions 12$b$ of the conductive layer 12), n$^+$-type source regions 65, p$^{++}$-type contact regions 66, and the p$^+$-type regions 21, 22, 67. In FIG. 15, the p$^+$-type regions 21, 22, 67 are indicated by the same hatching.

Figure 16:
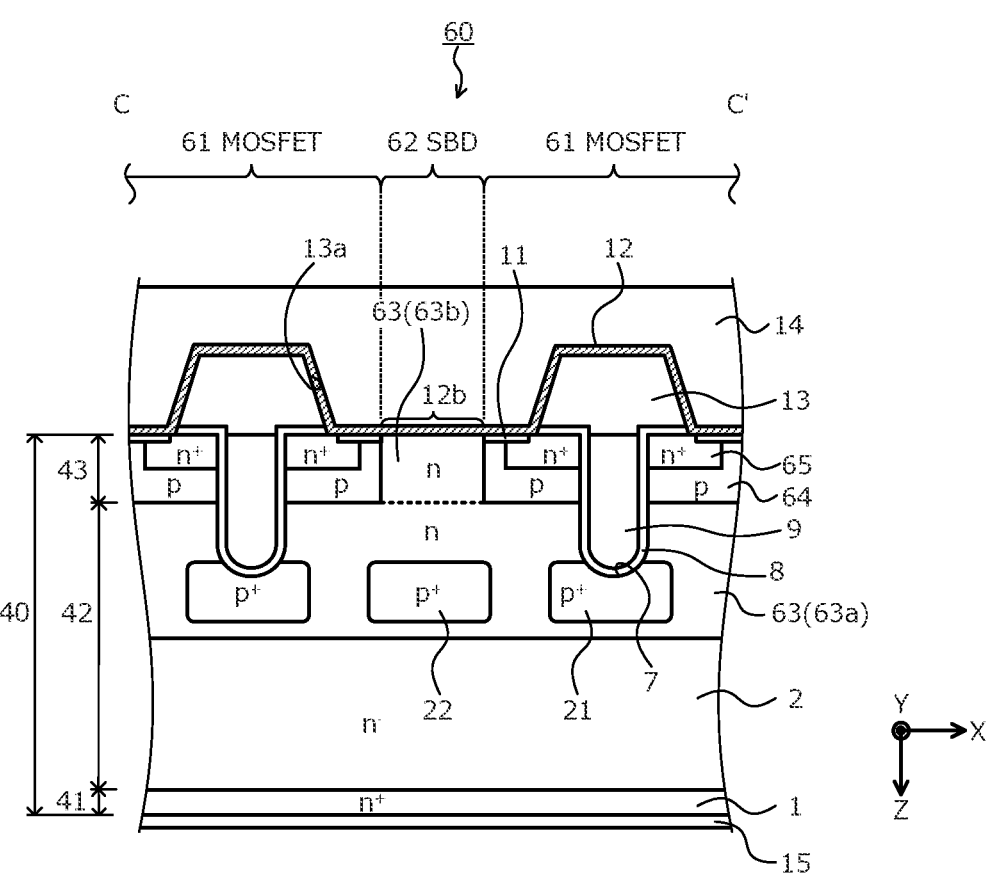
FIG. 16 is a cross-sectional view depicting the structure along cutting line C-C' in FIG. 15.
Figure 17:
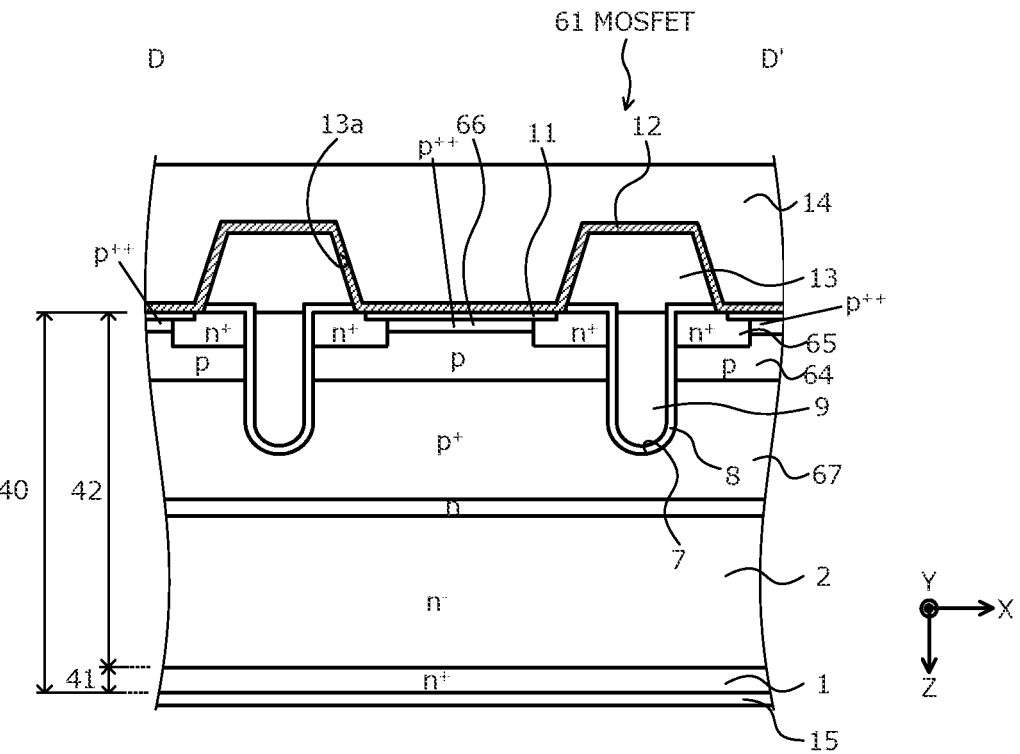
FIG. 17 is a cross-sectional view depicting the structure along cutting line D-D' in FIG. 15.
Figure 18:
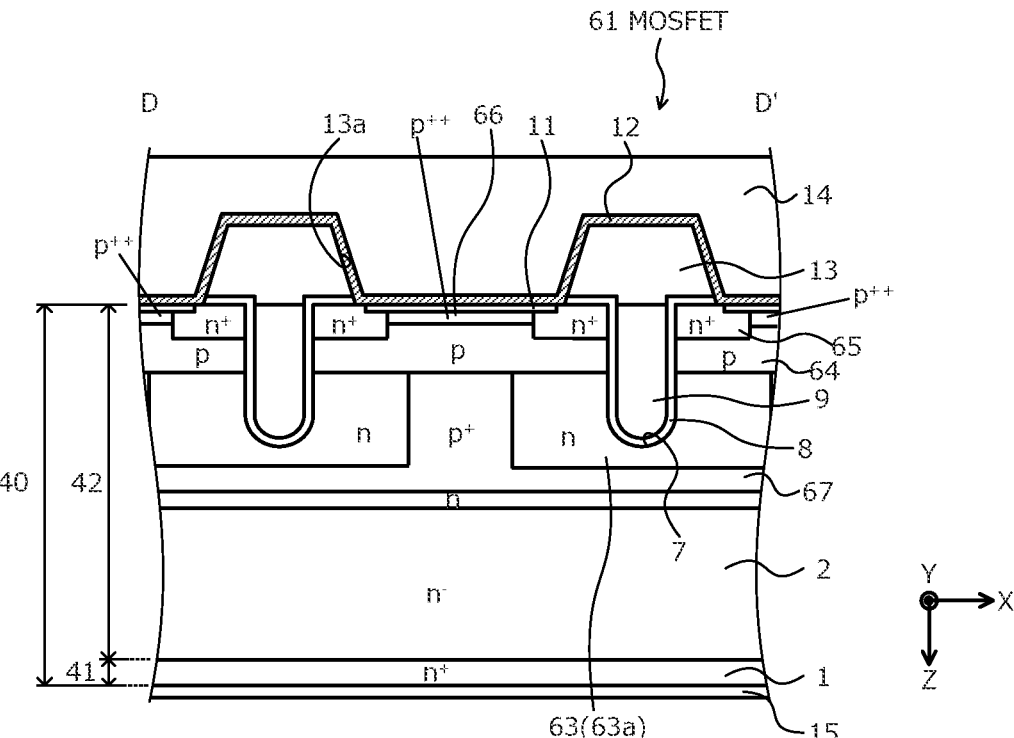
FIG. 18 is a cross-sectional view depicting another structure along cutting line D-D' in FIG. 15.

Further, in FIG. 15, the gate electrodes 9, the Schottky contact portions 12$b$ of the conductive layer 12, and the p$^{++}$-type contact regions 66 are indicated by different hatching and the p$^+$-type regions 21, 22,67 are indicated by different hatching. In FIG. 15, the n$^+$-type source regions 65 are indicated by broken lines and the gate insulating film 8 is not depicted. FIG. 16 is a cross-sectional view depicting the structure along cutting line C-C' in FIG. 15. A cross-section of the structure is the same as that in FIG. 2 except that reference character 12$a$ is changed to reference character 12$b$. FIGS. 17 and 18 are cross-sectional views depicting the structure along cutting line D-D' in FIG. 15.

In a silicon carbide semiconductor device 60 according to the second embodiment, a layout of p-type base regions 64 of the MOSFETs 61, the n$^+$-type source regions 65, the p$^{++}$-type contact regions 66, and the planar SBDs 62 differs from that of the silicon carbide semiconductor device 10 according to the first embodiment (refer to FIG. 1). In particular, in the second embodiment, the p$^{++}$-type contact regions 66 are scattered in the second direction Y parallel to the gate trenches 7, substantially centered between each adjacent two of the gate trenches 7. The p$^{++}$-type contact regions 66 are disposed apart from the gate trenches 7.

Between each adjacent two of the p$^{++}$-type contact regions 66 in the second direction Y, are second portions 63$b$ of n-type current spreading regions 63. In other words, in substantially the center between each adjacent two of the gate trenches 7, the p$^{++}$-type contact regions 66 and the second portions 63$b$ of the n-type current spreading regions 63 are disposed repeatedly alternating one another in the second direction Y. A width of the p$^{++}$-type contact regions 66 in the first direction X may be wider than a width of the second portions 63$b$ of the n-type current spreading regions 63. The p$^{++}$-type contact regions 66 and the second portions 63$b$ of the n-type current spreading regions 63, for example, may have a substantially square shape in a plan view.

The conductive layer 11 on the front surface of the semiconductor substrate 40 is in ohmic contact with the p$^{++}$-type contact regions 66. The conductive layer 12 on the front surface of the semiconductor substrate 40 is in Schottky contact with the second portions 63$b$ of the n-type current spreading regions 63. Similar to the first embodiment, the planar SBDs 62 are configured by the Schottky contact portions 12$b$ of the conductive layer 12. Thus, the planar SBDs 62 are disposed in a matrix-like pattern when viewed from the front side of the semiconductor substrate 40 and the MOSFETs 61 are disposed in a lattice-like shape surrounding peripheries of the planar SBDs 62.

Compared to the first embodiment, while the area (surface area) of the planar SBDs 62 is smaller, the area (surface area) of the ohmic contact portions between the p$^{++}$-type contact regions 66 and the conductive layer 11 may be increased and therefore, avalanche capability of the active region 51 may be increased. The n$^+$-type source regions 65 extend linearly in the second direction Y along the sidewalls of the gate trenches 7, parallel to the gate trenches 7, between the gate trenches 7 and the p$^{++}$-type contact regions 66. The n$^+$-type source regions 65 are in contact with the gate insulating film 8 at the sidewalls of the gate trenches 7.

At positions facing the p$^{++}$-type contact regions 66 in the depth direction Z, similarly to the first embodiment, p$^+$-type regions 67 that mitigate electric field applied to the gate insulating film 8 at the bottoms of the gate trenches 7 are provided linearly in the first direction X. Similar to the p$^+$-type regions 23 (refer to FIG. 3) in the first embodiment, an entire surface of the p$^+$-type regions 67 may be contact with the p-type base regions 64 (FIG. 17), or only portions facing the p$^{++}$-type contact regions 66 in the depth direction Z may be in contact with the p-type base regions 64 (FIG. 18).

In an instance in which only portions of the p$^+$-type regions 67 facing the p$^{++}$-type contact regions 66 in the depth direction Z are in contact with the p-type base regions 64 (FIG. 18), first portions 63$a$ of the n-type current spreading regions 63 intervene between the p-type base regions 64 and the p$^+$-type regions 67. As a result, closer to the n$^+$-type drain region 1 than are the p-type base regions 64, the entire surfaces of the sidewalls of the gate trenches 7 are surrounded by the first portions 63$a$ of the n-type current spreading regions 63 and areas where the p$^+$-type regions 67 are disposed also may be operated as the MOSFETs 61, whereby ON resistance of the MOSFETs 61 is reduced.

The p-type base regions 64 are disposed at portions along the sidewalls of the gate trenches 7 and directly beneath the p$^{++}$-type contact regions 66 (sides thereof facing the n$^+$-type drain region 1). The p-type base regions 64, for example, have a grid-like shape (in a plane view) surrounding peripheries of the second portions 63$b$ of the n-type current spreading regions 63, between each adjacent two of the gate trenches 7. The p-type base regions 64 may be exposed at the front surface of the semiconductor substrate 40, between the p$^{++}$-type contact regions 66 and the second portions 63$b$ of the n-type current spreading regions 63.

As described above, according to the second embodiment, effects similar to those of the first embodiment may be obtained. Further, according to the second embodiment, the area (surface area) of the body diode of the MOSFET may be relatively increased, whereby avalanche capability of the active region may be enhanced.

Figure 19:
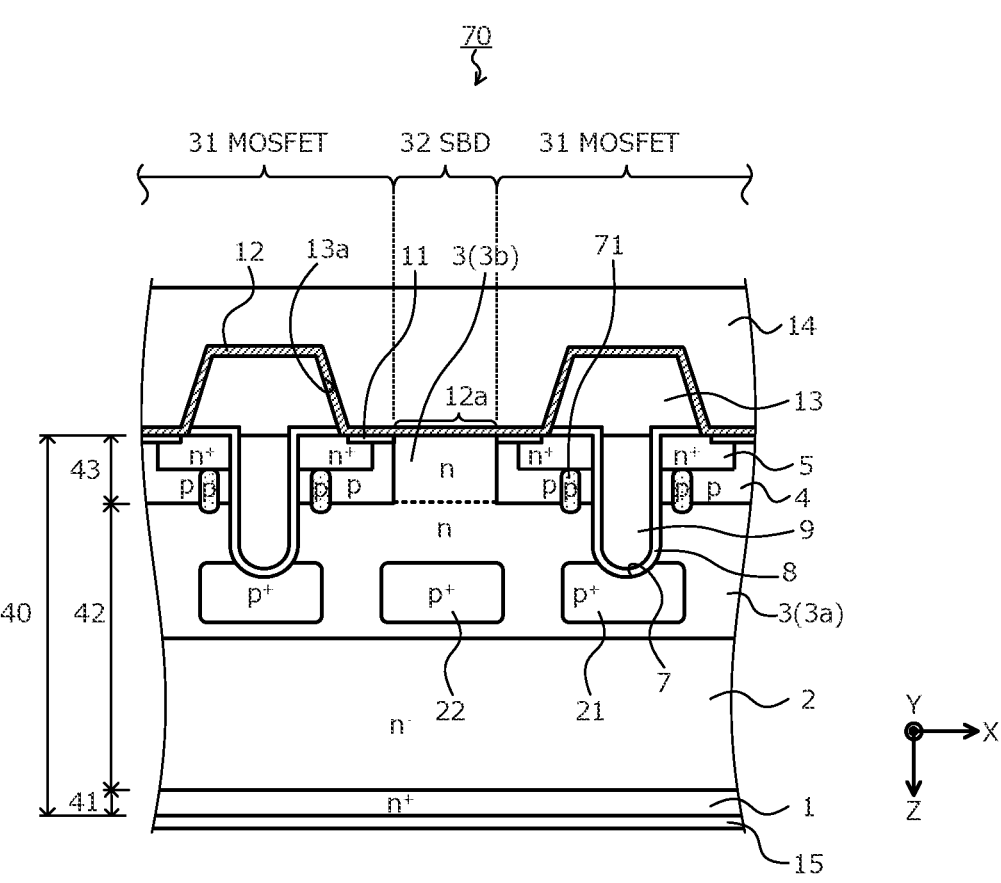
FIG. 19 is a cross-sectional view depicting a structure of a silicon carbide semiconductor device according to a third embodiment.

Next, a structure of a silicon carbide semiconductor device according to a third embodiment is described. FIG. 19 is a cross-sectional view depicting a structure of the silicon carbide semiconductor device according to the third embodiment. A layout of a silicon carbide semiconductor device 70 according to the third embodiment, when viewed from the front side of the semiconductor substrate 40 is similar to that depicted in FIG. 1. FIG. 19 corresponds to a cross-section of the structure along cutting line A-A' in FIG. 1 (cross section of the structure cut through the $n^+$-type source regions 5). A cross section of the structure cut through the $p^{++}$-type contact regions 6 of the silicon carbide semiconductor device 70 according to the third embodiment is similar to that in FIG. 3.

The silicon carbide semiconductor device 70 according to the third embodiment differs from the silicon carbide semiconductor device 10 according to the first embodiment (refer to FIGS. 1 to 3) in that p-type high-concentration regions 71 having an impurity concentration higher than that of the p-type base regions 4 are provided directly beneath the $n^+$-type source regions 5 (sides facing the $n^+$-type drain region 1), in the p-type base regions 4. The p-type high-concentration regions 71 are provided directly beneath the $n^+$-type source regions 5, in the depth direction Z, from the pn junctions between the p-type base regions 4 and the $n^+$-type source regions 5 to the pn junctions between the p-type base regions 4 and the first portions 3a of the n-type current spreading region 3.

The p-type high-concentration regions 71 are provided apart from the sidewalls of the gate trenches 7. When the MOSFETs 31 are ON, channels (n-type inversion layer) are formed between the p-type high-concentration regions 71 and the gate trenches 7, adjacent to the p-type high-concentration regions 71. The p-type high-concentration regions 71 function as so-called HALO regions that suppress spreading of a depletion layer in the p-type base regions 4, from the pn junctions between the p-type base regions 4 and the $n^+$-type source regions 5 and the pn junctions between the p-type base regions 4 and the first portions 3a of the n-type current spreading region 3.

A method of manufacturing the silicon carbide semiconductor device 70 according to the third embodiment may be implemented by ion-implanting a p-type impurity into both sidewalls of the gate trenches 7 in the method of manufacturing the silicon carbide semiconductor device 10 according to the first embodiment (refer to FIGS. 4 to 10), after formation of the gate trenches 7 but before formation of the gate insulating film 8, the p-type impurity being implanted from a direction oblique to the respective trench sidewall, in one or more stages (hereinafter, oblique ion implantation). By providing the p-type high-concentration regions 71, the thickness of the p-type epitaxial layer 43 may be decreased and the channel may be shortened.

Thus, depths of the second portions 3b of the n-type current spreading region 3 (refer to FIGS. 7 and 8) and the p-type base regions 4 (refer to FIGS. 13 and 14) may be reduced and the acceleration energy of the ion implantations for forming these regions may be lowered. In particular, for example, by ion implantation with an acceleration energy of about 700 keV and, for example, assuming a depth to about 0.8 μm from the front surface of the semiconductor substrate 40 (ion implantation surface) as a range, the second portions 3b of the n-type current spreading region 3 and the p-type base regions 4 that penetrate through the epitaxial layers 43, 44 in the depth direction Z may be formed having a box profile from the front surface of the semiconductor substrate 40 to a depth equivalent to about the range.

For example, in an instance in which nitrogen is ion-implanted in the p-type epitaxial layer 43 to thereby form the second portions 3b of the n-type current spreading region 3 (refer to FIGS. 7 and 8), the second portions 3b of the n-type current spreading region 3 may be formed exhibiting an impurity concentration box profile of about $1 \times 10^{17}/cm^3$ over a range from the front surface of the semiconductor substrate 40 to a depth of about 0.7 μm. For example, in an instance in which aluminum is ion-implanted in the n-type epitaxial layer 44 to thereby form the p-type base regions 4 (refer to FIGS. 13 and 14), the p-type base regions 4 may be formed exhibiting an impurity concentration box profile of about $1 \times 10^{17}/cm^3$ over a range from the front surface of the semiconductor substrate 40 to a depth of about 0.8 μm.

The third embodiment may be applied to the silicon carbide semiconductor device according to the second embodiment (FIGS. 15 to 18) and thereby provide the p-type high-concentration regions 71 directly beneath the $n^+$-type source regions 65.

As described above, according to the third embodiment, effects similar to those of the first and second embodiments may be obtained. Further, according to the third embodiment, the p-type high-concentration regions constituting HALO regions are provided, whereby even when the channels are shortened by decreasing the thickness of the uppermost epitaxial layer where the second portions 3b of the n-type current spreading region 3 and the p-type base regions are formed, a tradeoff between ON resistance and short-circuit capability may be improved. Further, according to the third embodiment, the thicknesses of the p-type base regions and the thicknesses of the second portions 3b of the n-type current spreading regions may be decreased and therefore, high-energy (MeV) ion implantation for forming these regions is unnecessary. Thus, increased costs due to facility investment for high-energy ion implantation equipment, etc. may be prevented.

For example, in an instance in which the thickness of the p-type base regions and the thicknesses of the second portions 3b of the n-type current spreading regions are thick, in the formation of the p-type base regions or the second portions 3b of the n-type current spreading regions, high-energy ion implantation is performed or an epitaxial layer is deposited in multiple stages and for each deposition of the p-type epitaxial layer, ion implantation has to be performed. In an instance in which an epitaxial layer is deposited in multiple stages and ion implantation is performed for each deposition of the p-type epitaxial layer, the number of processes increases. On the other hand, according to the third embodiment, a single deposition of the epitaxial layer and formation of the p-type base regions or the second portions 3b of the n-type current spreading region 3 by one or more stages (sessions) of ion implantation by low acceleration energy to the epitaxial layer suffice to be performed and thus, increases in the number of processes may be prevented.

Figure 20:
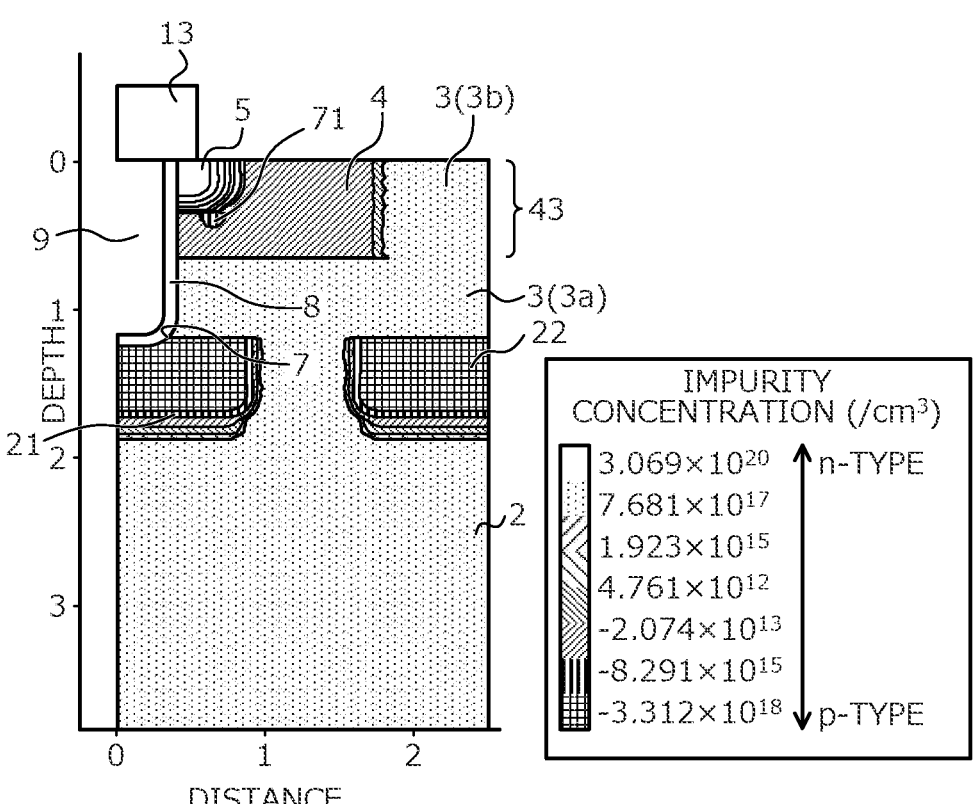
FIG. 20 is a distribution diagram showing doping concentration distribution close to second portions $3b$ of n-type current spreading regions of a first experimental example.

Results of simulation (hereinafter, first experimental example) of the impurity concentration distribution of the second portions 3b of the n-type current spreading region 3 formed by ion implantation of an n-type impurity in the p-type epitaxial layer 43 according to the method of manufacturing the silicon carbide semiconductor device 10 according to the first embodiment described above (refer to FIGS. 7 and 8) are shown in FIGS. 20 and 21 for the silicon carbide semiconductor device 70 according to the third embodiment. FIG. 20 is a distribution diagram showing doping concentration distribution close to the second portions 3b of the n-type current spreading regions of the first experimental example. FIG. 21 is a distribution diagram showing n-type doping concentration distribution of the second portions 3b of the n-type current spreading regions in FIG. 20. In a legend in FIG. 20, n-type impurity concentrations are indicated by positive numeric values and p-type impurity concentrations are indicated by negative numeric values (similarly in FIG. 23).

In the first experimental example, the impurity concentration and the thickness of the p-type epitaxial layer 43 were set to be about $1.3\times10^{17}/cm^3$ and about 0.8 μm, respectively. The ion implantation of nitrogen (N) was divided into 8 stages of differing acceleration energies and dose amounts so that the impurity concentration of the second portions 3b of the n-type current spreading region 3 became $1.2\times10^{17}/cm^3$ by an acceleration energy of not more than 700 keV. The environmental temperature during the ion implantation was set to be room temperature (25 degrees C.). The ion implantation conditions are shown in FIG. 22. FIG. 22 is a table showing ion implantation conditions for the n-type impurity (nitrogen) in a first example. In FIG. 22, one row shows the ion implantation conditions for one stage.

From the results shown in FIGS. 20 and 21, it was confirmed that even when the ion implantation of the nitrogen for forming the second portions 3b of the n-type current spreading region 3 is not high-energy ion implantation, but rather performed by a low acceleration energy of, for example, about 700 keV, the impurity concentration may be set to exhibit a substantially uniform box profile of at least about $1\times10^{17}/cm^3$ over the range of the depth of the second portions 3b of the n-type current spreading region 3, from the front surface of the semiconductor substrate 40 to a depth of 0.7 μm. The portion 72 having a relatively low impurity concentration close to the front surface of the semiconductor substrate 40 (ion implantation surface) is removed by sacrificial oxidation and therefore, is not left in the product.

Figure 23:
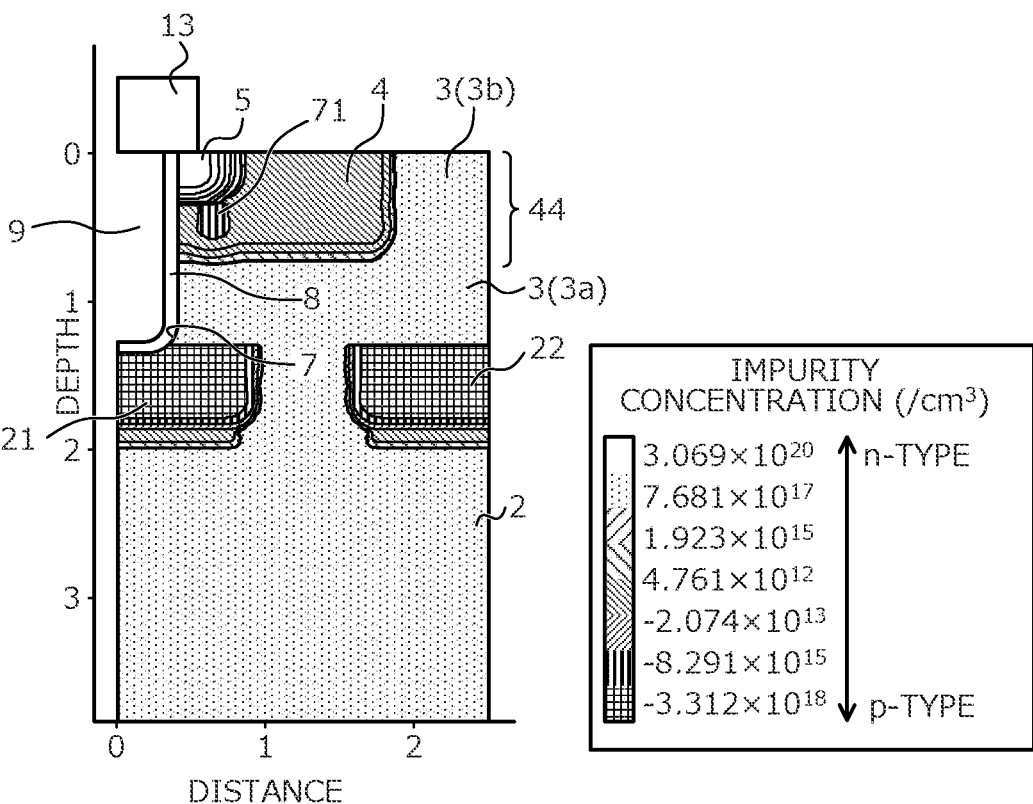
FIG. 23 is a distribution diagram showing doping concentration distribution close to p-type base regions of a second experimental example.
Figures 24, 25:
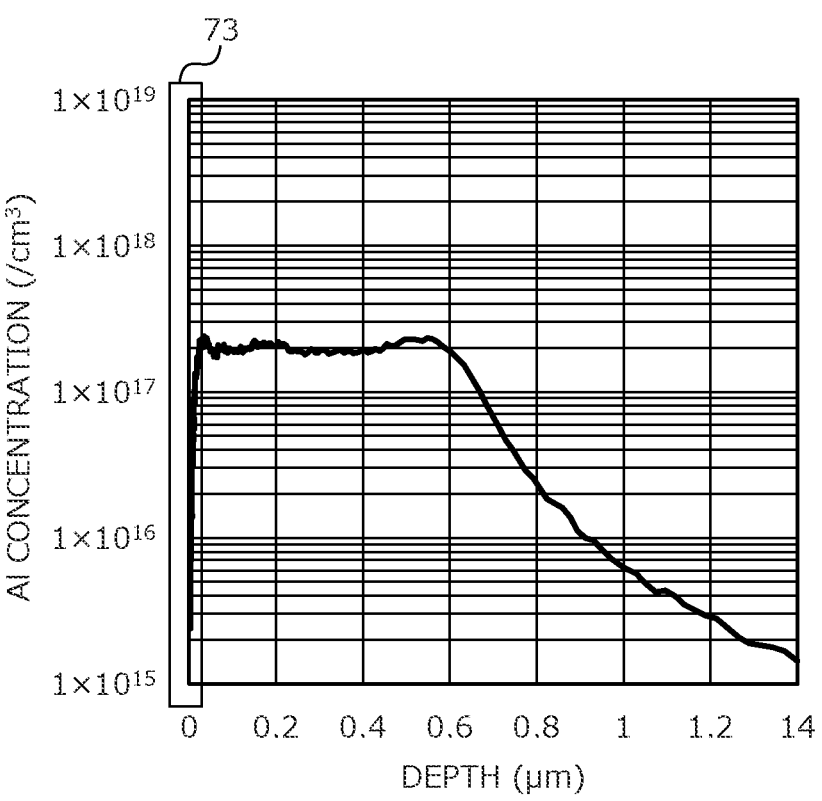
FIG. 24 is a distribution diagram showing p-type doping concentration distribution of the p-type base regions in FIG. 23.
FIG. 25 is a table showing ion implantation conditions for a p-type impurity (aluminum) in a second example.

Results of simulation (hereinafter, second experimental example) of the impurity concentration distribution of the p-type base regions 4 formed by ion implantation of a p-type impurity in the n-type epitaxial layer 44 according to another example of the method of manufacturing the silicon carbide semiconductor device 10 according to the first embodiment described above (refer to FIGS. 13 and 14) are shown in FIGS. 23 and 24 for the silicon carbide semiconductor device 70 according to the third embodiment described above. FIG. 23 is a distribution diagram showing doping concentration distribution close to the p-type base regions of the second experimental example. FIG. 24 is a distribution diagram showing p-type doping concentration distribution of the p-type base regions in FIG. 23.

In the second experimental example, the impurity concentration and the thickness of the n-type epitaxial layer 44 were set to be about $3.0\times10^{16}/cm^3$ and about 0.8 μm, respectively. The ion implantation of aluminum (Al) was divided into 8 stages of differing acceleration energies and dose amounts so that the impurity concentration of the p-type base regions 4 became about $1\times10^{17}/cm^3$ by an acceleration energy of not more than 700 keV. The environmental temperature during the ion implantation was set to be (500 degrees C.). The ion implantation conditions are shown in FIG. 25. FIG. 25 is a table showing ion implantation conditions for the p-type impurity (aluminum) in a second example. In FIG. 25, one row shows the ion implantation conditions for one stage.

From the results shown in FIGS. 23 and 24, it was confirmed that even when the ion implantation of the aluminum for forming the p-type base regions 4 is not high-energy ion implantation, but rather performed by a low acceleration energy of, for example, about 700 keV, the impurity concentration may be set to exhibit a substantially uniform box profile of at least about $1\times10^{17}/cm^3$ over the range of the depth of the p-type base regions 4, from the front surface of the semiconductor substrate 40 to a depth of 0.7 μm.

Further, the p-type impurity concentration of the p-type base regions 4 was confirmed to be higher than the n-type impurity concentration of the n-type epitaxial layer 44 (the second portions 3b of the n-type current spreading region 3) in the range from the front surface of the semiconductor substrate 40 (surface of the n-type epitaxial layer 44) to a depth of 0.8 μm. A portion 73 having a relatively low impurity concentration close to the front surface of the semiconductor substrate 40 (ion implantation surface) is removed by sacrificial oxidation and therefore, is not left in the product.

In the foregoing, the present invention may be variously modified within a range not departing from the spirit of the invention and in the embodiments and the examples, for example, dimensions, impurity concentrations, etc. of regions may be variously set according to necessary specifications. Further, the present invention achieves the same effects even in an instance in which a wide bandgap semiconductor other than silicon carbide (for example, gallium (Ga), etc.) is applied. Further, the present invention is similarly implemented when the conductivity types (n-type, p-type) are reversed.

According to the invention described above, SBDs may be built into a single semiconductor substrate having unit cells of MOSFETs disposed between all adjacent trenches.

The silicon carbide semiconductor device and method of manufacturing a silicon carbide semiconductor device according to the present invention achieve an effect in that in MOSFETs in which planar SBDs are built into the same semiconductor substrate in which the MOSFETs are provided, the density of the MOSFETs may be maintained while degradation of forward characteristics of the body diodes of the MOSFETs may be suppressed.

As described above, the silicon carbide semiconductor device and the method of manufacturing a silicon carbide semiconductor device according to the present invention is suitable for MOSFETs of a trench gate structure, in which planar SBDs are built into the same semiconductor substrate in which the MOSFETs are provided.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide, the semiconductor substrate having a first main surface and a second main surface opposite to each other;
a first semiconductor region of a first conductivity type, provided in the semiconductor substrate;
a plurality of second semiconductor regions of a second conductivity type, selectively provided between the first main surface of the semiconductor substrate and the first semiconductor region;

a plurality of third semiconductor regions of the first conductivity type, selectively provided between the first main surface of the semiconductor substrate and the plurality of second semiconductor regions;

a plurality of trenches, respectively penetrating through the plurality of third semiconductor regions and through the plurality of second semiconductor regions, and reaching the first semiconductor region;

a plurality of gate electrodes, each provided in one of the plurality of trenches via a gate insulating film;

a first conductive film provided at the first main surface of the semiconductor substrate, in ohmic contact with the plurality of second semiconductor regions and the plurality of third semiconductor regions;

a first electrode provided on the first main surface of the semiconductor substrate and connected to the first conductive film;

a second electrode provided on the second main surface of the semiconductor substrate;

a plurality of first high-concentration regions of the second conductivity type, selectively provided in the first semiconductor region and apart from the plurality of second semiconductor regions, the plurality of first high-concentration regions being closer to the second electrode than are bottoms of the plurality of trenches, and respectively facing the plurality of trenches in a depth direction of the silicon carbide semiconductor device;

a plurality of second high-concentration regions of the second conductivity type, selectively provided in the first semiconductor region, the plurality of second high-concentration regions being apart from the plurality of trenches, the plurality of second semiconductor regions, and the plurality of first high-concentration regions, the plurality of second high-concentration regions being closer to the second electrode than are the bottoms of the plurality of trenches; and a second conductive film provided on the first main surface of the semiconductor substrate, the second conductive film being connected to the first electrode, wherein the first semiconductor region has:

a first portion that is closer to the second electrode than is the plurality of second semiconductor regions, the first portion forming a portion of a sidewall of each of the plurality of trenches; and a plurality of second portions respectively provided at positions facing the plurality of second high-concentration regions in the depth direction, the plurality of second portions being exposed at the first main surface of the semiconductor substrate, and each being sandwiched between, and being in direct contact with, adjacent two of the plurality of second semiconductor regions in a top view of the silicon carbide semiconductor device, and the second conductive film forms a Schottky contact with the plurality of second portions of the first semiconductor region, such that each junction surface between the second conductive film and the first semiconductor region forms a Schottky barrier of a Schottky barrier diode.

2. The silicon carbide semiconductor device according to claim 1, wherein the plurality of second semiconductor regions is formed in a second-conductivity-type epitaxial layer, and the plurality of second portions is a plurality of diffused regions formed by ion implantation of a first impurity in the second-conductivity-type epitaxial layer.

3. The silicon carbide semiconductor device according to claim 1, wherein the plurality of second portions is formed in a first-conductivity-type epitaxial layer, and the plurality of second semiconductor regions is a plurality of diffused regions formed by ion implantation of a second impurity in the first-conductivity-type epitaxial layer.

4. The silicon carbide semiconductor device according to claim 1, further comprising a HALO region of the second conductivity type, which extends, in the depth direction, from a pn junction between one of the plurality of second semiconductor regions and one of the plurality of third semiconductor regions, to a pn junction between one of the plurality of second semiconductor regions and the first portion.

5. The silicon carbide semiconductor device according to claim 1, further comprising a plurality of fourth semiconductor regions of the second conductivity type, selectively provided between the first main surface of the semiconductor substrate and the plurality of second semiconductor regions, and having an impurity concentration higher than an impurity concentration of the plurality of second semiconductor regions, wherein the plurality of trenches extends in parallel, in a direction parallel to the first main surface of the semiconductor substrate, the first conductive film is in ohmic contact with the plurality of third semiconductor regions and the plurality of fourth semiconductor regions, and the plurality of fourth semiconductor regions and the plurality of second portions are disposed alternately, each extending in the direction parallel to the first main surface of the semiconductor substrate.

6. The silicon carbide semiconductor device according to claim 5, further comprising a plurality of third high-concentration regions of the second conductivity type in contact with the plurality of second semiconductor regions, the plurality of first high-concentration regions, and the plurality of second high-concentration regions, respectively at positions facing the plurality of fourth semiconductor regions in the depth direction, the plurality of third high-concentration regions being closer to the second electrode than is the plurality of second semiconductor regions and than are the bottoms of the plurality of trenches, and forming another portion of the sidewall of each of the plurality of trenches.

7. The silicon carbide semiconductor device according to claim 5, further comprising a plurality of third high-concentration regions of the second conductivity type, provided closer to the second electrode than are the bottoms of the plurality of trenches, respectively at positions facing the plurality of fourth semiconductor regions in the depth direction, the plurality of third high-concentration regions being apart from the plurality of trenches but in contact with the plurality of second semiconductor regions, the plurality of first high-concentration regions, and the plurality of second high-concentration regions.

8. The silicon carbide semiconductor device according to claim 2, wherein an impurity concentration of the first conductivity type of the plurality of second portions exhibits a uniform box profile of at least $1 \times 10^{17}$/cm$^3$ in a range from the first main surface of the semiconductor substrate to a depth of 0.7 μm.

9. The silicon carbide semiconductor device according to claim 3, wherein an impurity concentration of the second conductivity type of the plurality of second semiconductor regions exhibits a uniform box profile of at least $1 \times 10^{17}$/cm$^3$ in a range from the first main surface of the semiconductor substrate to a depth of 0.7 μm.

10. The silicon carbide semiconductor device according to claim 9, wherein the impurity concentration of the second conductivity type of the plurality of second semiconductor regions is higher than an impurity concentration of the first conductivity type of the plurality of second portions, within a range from the first main surface of the semiconductor substrate to a depth of 0.8 μm.

11. The silicon carbide semiconductor device according to claim 1, wherein the first semiconductor region has an impurity concentration that is higher in the first portion and in the plurality of second portions than in other portions of the first semiconductor region.

12. A method of manufacturing the silicon carbide semiconductor device according to claim 4, the method comprising:

preparing a starting substrate containing silicon carbide, the starting substrate having a first surface and a second surface opposite to each other;

growing a first epitaxial layer of the first conductivity type on the first surface of the starting substrate;

selectively forming a plurality of high-concentration regions of the second conductivity type in the first epitaxial layer by a first ion implantation of an impurity of the second conductivity type, such that a portion of the first epitaxial layer, except for the plurality of high-concentration regions of the second conductivity type, forms the first portion of the first semiconductor region of the first conductivity type;

growing a second epitaxial layer on a surface of the first epitaxial layer after forming the first epitaxial layer;

selectively forming, in the second epitaxial layer, the plurality of second portions of the first semiconductor region that are connected to the first portion of first semiconductor region, and the plurality of second semiconductor regions of the second conductivity type, each of the plurality of second portions being sandwiched between, and being in direct contact with, adjacent two of the plurality of second semiconductor regions in a top view of the starting substrate;

forming the plurality of third semiconductor regions of the first conductivity type, in a plurality of surface regions of the plurality of second semiconductor regions;

forming the plurality of trenches that penetrate through the plurality of third semiconductor regions and the plurality of second semiconductor regions and reach the first epitaxial layer;

forming a plurality of HALO regions of the second conductivity type by a second ion implantation of the impurity of the second conductivity type, from sidewalls of the plurality of trenches, each of the plurality of HALO regions extending, in the depth direction of the silicon carbide semiconductor device, from a first pn junction between one of the plurality of second semiconductor regions and the first portion, to a second pn junction between said one of the plurality of second semiconductor regions and one of the plurality of third semiconductor regions;

forming the plurality of gate electrodes, each in one of the plurality of trenches via the gate insulating film, after forming the plurality of HALO regions;

forming the first conductive film at a surface of the second epitaxial layer, after forming the plurality of gate electrodes, the first conductive film being in ohmic contact with the plurality of second semiconductor regions and the plurality of third semiconductor regions;

forming the second conductive film at the surface of the second epitaxial layer, after forming the plurality of gate electrodes, the second conductive film forming a Schottky contact with each of the plurality of second portions, such that each junction surface between the second conductive film and the first semiconductor region forms the Schottky barrier of the Schottky barrier diode;

forming the first electrode on the surface of the second epitaxial layer, the first electrode being connected to the first conductive film and the second conductive film; and forming the second electrode on the second surface of the starting substrate, wherein forming the plurality of high-concentration regions of the second conductivity type includes:

selectively forming, as the plurality of high-concentration regions of the second conductivity type, in a plurality of formation regions of the plurality of trenches in the first epitaxial layer, the plurality of first high-concentration regions of the second conductivity type, the plurality of first high-concentration regions being closer to the starting substrate than is the plurality of trenches, and selectively forming in the first epitaxial layer, between each adjacent two of the plurality of formation regions of the plurality of trenches, as the plurality of high-concentration regions of the second conductivity type, the plurality of second high-concentration regions of the second conductivity type, apart from the plurality of first high-concentration regions, the plurality of second high-concentration regions being closer to the starting substrate than is the plurality of trenches;

when the second epitaxial layer is of the second conductivity type, forming the plurality of second portions of the first semiconductor region and the plurality of second semiconductor regions includes performing a third ion implantation of an impurity of the first conductivity type by an acceleration energy of not more than 700 keV, thereby forming, in portions facing the plurality of second high-concentration regions in the depth direction, the plurality of second portions penetrating through the second epitaxial layer in the depth direction, such that a plurality of portions of the second epitaxial layer, other than the plurality of second portions, forms the plurality of second semiconductor regions; and when the second epitaxial layer is of the first conductivity type, forming the plurality of second portions of the first semiconductor region and the plurality of second semiconductor regions includes performing a fourth ion implantation of the impurity of the second conductivity type by an acceleration energy of not more than 700 keV, thereby forming the plurality of second semiconductor regions penetrating through the second epitaxial layer in the depth direction, such that a plurality of portions of the second epitaxial layer, other than the plurality of second semiconductor regions and facing the plurality of second high-concentration regions in the depth direction, forms the plurality of second portions.

* * * * *